US012294132B2

(12) United States Patent
Natarajan et al.

(10) Patent No.: US 12,294,132 B2
(45) Date of Patent: May 6, 2025

(54) RECONFIGURABLE POWER DIVIDER/COMBINER

(71) Applicant: SIVERS SEMICONDUCTORS, INC., Chatham, NJ (US)

(72) Inventors: Arun Natarajan, Corvallis, OR (US); Harish Krishnaswamy, New York, NY (US)

(73) Assignee: Sivers Semiconductors, Inc., Chatham, NJ (US)

( * ) Notice: Subject to any disclaimer, the term of this patent is extended or adjusted under 35 U.S.C. 154(b) by 243 days.

(21) Appl. No.: 17/510,343

(22) Filed: Oct. 25, 2021

(65) Prior Publication Data

US 2022/0131253 A1 Apr. 28, 2022

Related U.S. Application Data

(60) Provisional application No. 63/106,045, filed on Oct. 27, 2020.

(51) Int. Cl.
*H01P 5/12* (2006.01)
*H03F 3/19* (2006.01)
*H04B 1/40* (2015.01)

(52) U.S. Cl.
CPC ............. *H01P 5/12* (2013.01); *H03F 3/19* (2013.01); *H04B 1/40* (2013.01); *H03F 2200/451* (2013.01)

(58) Field of Classification Search
CPC ............. H03F 2200/451; H03F 3/72; H03F 2200/294; H03F 3/195; H03F 3/245; H03F 3/68; H03F 1/56; H03F 3/211; H03F 3/602; H03F 1/223; H03F 2200/111; H03F 2203/7209; H03F 1/0277; H03F 1/565; H03F 3/19; H03F 1/0261; H03F 2200/204; H03F 2200/372; H03F 2203/7233; H01P 5/16; H01P 1/18; H01P 5/18; H01P 5/04;

(Continued)

(56) References Cited

U.S. PATENT DOCUMENTS

| 2008/0136554 | A1 | 6/2008 | He et al. | |
|---|---|---|---|---|
| 2013/0127564 | A1* | 5/2013 | Ding | H01P 5/16 333/136 |
| 2019/0149104 | A1* | 5/2019 | Suravarapu | H03F 3/602 330/124 R |

OTHER PUBLICATIONS

International Search Report and Written Opinion of the International Searching Authority from PCT/US2021/056585, mail date Mar. 1, 2022 pp. 1-11.

* cited by examiner

*Primary Examiner* — Golam Sorowar
(74) *Attorney, Agent, or Firm* — Straub & Straub; Michael P. Straub; Stephen T. Straub

(57) ABSTRACT

Methods and apparatus for implementing a circuit capable of operating as a passive power divider or combiner are described. In at least some embodiments multiple modes of operation are supported with one of the modes being a mode in which power is not communicated along one of the paths in the circuit, e.g., because the path leads to an inactive component or element. The methods and apparatus are well suited for use in communications devices and/or transceiver circuits. The passive nature of the power combiner/divider allows the device in some embodiments to act as a power divider when signals pass through the circuit in a first direction, e.g., during a transmit mode of operation, and to act as a power combiner when signals pass through the circuit in the other direction, e.g., during a receive mode of operation.

21 Claims, 13 Drawing Sheets

(58) Field of Classification Search
CPC .... H01P 5/184; H01P 1/15; H01P 5/12; H01P 5/19; H01P 3/08; H01P 1/365; H01P 5/187; H01P 5/227; H03H 7/48; H03H 7/20; H03H 7/004; H03H 7/463; H03H 2210/025; H03H 7/461; H03H 7/09; H03H 11/362; H03H 7/06; H03H 7/38; H03H 11/16; H03H 11/20; H03H 11/36; H03H 11/04; H03H 11/1256; H03H 11/126; H03H 11/22; H03H 2210/012; H03H 2210/04; H03H 7/1775; H04B 1/0458; H04B 1/40; H04B 1/44; H04B 1/18; H04B 1/006; H04B 1/525; H04B 7/0602; H04B 1/0057; H04B 1/0483; H04B 1/38; H04B 1/48; H04B 7/18515; H04B 7/0617; H04B 1/005; H04B 1/401; H04B 1/52; H04B 7/0671; H04B 1/0064; H04B 1/04; H04B 1/0475
See application file for complete search history.

RECONFIGURABLE POWER DIVIDER/COMBINER

RELATED APPLICATIONS

The present application claims the benefit of U.S. Provisional Application Ser. No. 63/106,045 filed Oct. 27, 2020 which is hereby expressly incorporated by reference in its entirety.

FIELD

The present application relates to methods and apparatus for implementing and using reconfigurable power divider/combiners and more particularly reconfigurable passive power divider/combiners which are well suited for use in wireless communications devices.

BACKGROUND

FIG. 1 is a drawing 100 which shows a known passive power combiner 106 operating under different conditions. Drawing 101 of FIG. 1 illustrates an example in which both path 1 110 and path 2 112 are active. The passive power combiner 106 receives input signals from first amplifier 102 and second amplifier 104, combines the received signals and outputs a combined signal to the input of third amplifier 108. Drawing 151 of FIG. 1 illustrates an example, in which path 1 160 is an active path and path 2 162 is an inactive path. The passive power combiner 106 receives signals to be combined from first amplifier 102, but does not receive signals to be combined from inactive amplifier 104 (indicated by dashed lines). The inactive path 162 results in loss in the passive power combiner. If the passive power combiner is utilized as a passive splitter, the inactive pass also results in loss.

FIG. 2 is a drawing 200 which shows a known passive power divider 204 operating under different conditions. Drawing 201 of FIG. 2 illustrates an example in which both path 1 210 (between the output of amplifier 202 and the input of amplifier 206) and path 2 212 (between the output of amplifier 202 and the input of amplifier 208) are active, and the power splits 3 dB. The passive power divider 204 receives an input signal from first amplifier 202, splits the received signal and outputs the split reduced power signals to the input of each amplifier 206, 208. Drawing 251 of FIG. 2 illustrates an example, in which path 1 260 (between the output of amplifier 202 and the input of amplifier 206) is an active path and path 2 262 (between the output of amplifier 202 and the input of amplifier 208) is an inactive path (as indicated by amplifier 208 being indicated as inactive by dashed lines). In the example of drawing 251, the inactive path within the prior art passive power divider 204 still consumes half of the power.

For many applications including phased arrays of communications devices, it is desirable to include power dividers and/or combiners that can be used to combine and/or distribute signals to multiple elements. In many scenarios, it is desirable to operate with a subset of elements operational while other elements are inactive. In such a case, a power divider that distributes signals to all elements even when some elements are inactive is inefficient since such a power divider distributes power to inactive elements. To compensate for power loss, elements that provide an active gain may be used in some systems but this tends to be inefficient and/or makes it difficult to use the circuit as both a power divider and combiner since the gain elements may be intended for signals passing through the circuit in a particular direction making it difficult for the device to operate as a combiner when signals are passed in the reverse direction through the device. Accordingly, for efficiently and flexibility reasons it can be desirable to avoid the use of active power dividers and/or combiners.

In view of the above it should be appreciated that there is a need for improved passive power dividers and/or combiners. It would be desirable if at least some new or improved power divider and/or combiner circuits could be implemented such that, when a path through the power divider/combiner leads to an inactive element which does not require power given the mode of operation, the supply of power to that path was eliminated and the power that would otherwise have been provided on the path to the inactive element is distributed to one or more other paths. Thus, it should be appreciated from a power efficiency perspective that there is a need for a reconfigurable passive circuit that can support multiple operating modes, at least a first mode in which the device operates as a power divider or combiner and a second mode in which the passive circuit operates as a thru path if one or more of the paths through the device is inactive. As should be appreciated, improved passive power divider/combiners are desirable even if such multiple modes are not supported in a particular embodiment.

SUMMARY

Methods and apparatus for implementing a circuit capable of operating as a passive power divider or combiner are described. In at least some embodiments multiple modes of operation are supported with one of the modes being a mode in which power is not communicated along one of the paths in the circuit, e.g., because the path leads to an inactive component or element. The methods and apparatus are well suited for use in communications devices and/or transceiver circuits. The passive nature of the power combiner/divider allows the device in some embodiments to act as a power divider when signals pass through the circuit in a first direction, e.g., during a transmit mode of operation, and to act as a power combiner when signals pass through the circuit in the other direction, e.g., during a receive mode of operation. In cases where a path leads to a transmit or receive element that is not to be used at a given time, e.g., because of a beam to be used at the given time or a transmit/receive direction to be supported at a given time, power is not communicated onto the path or combined from the path. Thus, various embodiments provide an efficient power divider or combiner that is well suited for use with transmit and/or receive antenna arrays of a communications device. The passive power divider/combiner and be implemented to support a wide range of frequencies including GHz frequency ranges.

In various embodiments the circuits are used as a passive power divider during one mode of communication operation, e.g., a transmit mode of operation, and as a power combiner during another mode of operation, e.g., a receive mode of operation. Accordingly, the circuits in some embodiments are referred to as passive power divider/combiner circuits. However, in some embodiments the circuits are used simply as controllable power dividers and in some other embodiments the circuits are simply used as controllable power combiners. Accordingly, it should be appreciated that the circuits are not limited to embodiments where the circuit is used as both a power combiner and a power divider, e.g., during different modes of communications device operation.

An exemplary circuit assembly, operable as either a power divider or power combiner, in accordance with some embodiments, comprises: a first port; a second port; an impedance and switch interconnect circuit controllably connecting the first port to the second port; a third port; a port coupling assembly coupling the first and second ports to the third port; a first controllable switch assembly controllably coupling the first port to ground (via a capacitor); a second controllable switch assembly controllably coupling the second port to ground (via a capacitor); and a third controllable switch assembly controllably coupling the third port to ground (via a capacitor).

While various features discussed in the summary are used in some embodiments it should be appreciated that not all features are required or necessary for all embodiments and the mention of features in the summary should in no way be interpreted as implying that the feature is necessary or critical for all embodiments.

Numerous additional features and embodiments are discussed in the detailed description which follows.

DETAILED DESCRIPTION

Figure 1:
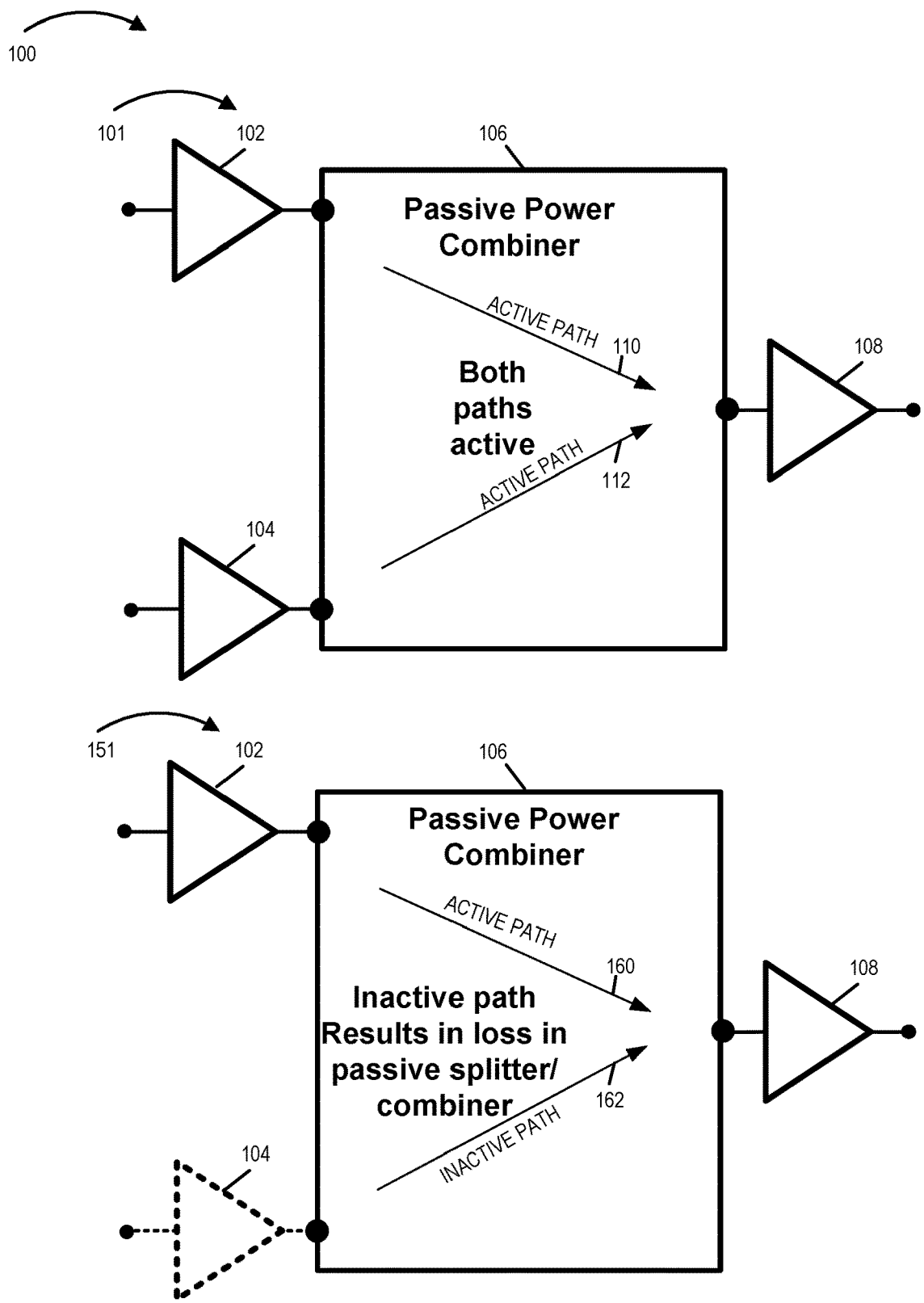
FIG. 1 is a drawing which shows prior art passive power combiner operation under different conditions.
Figure 2:
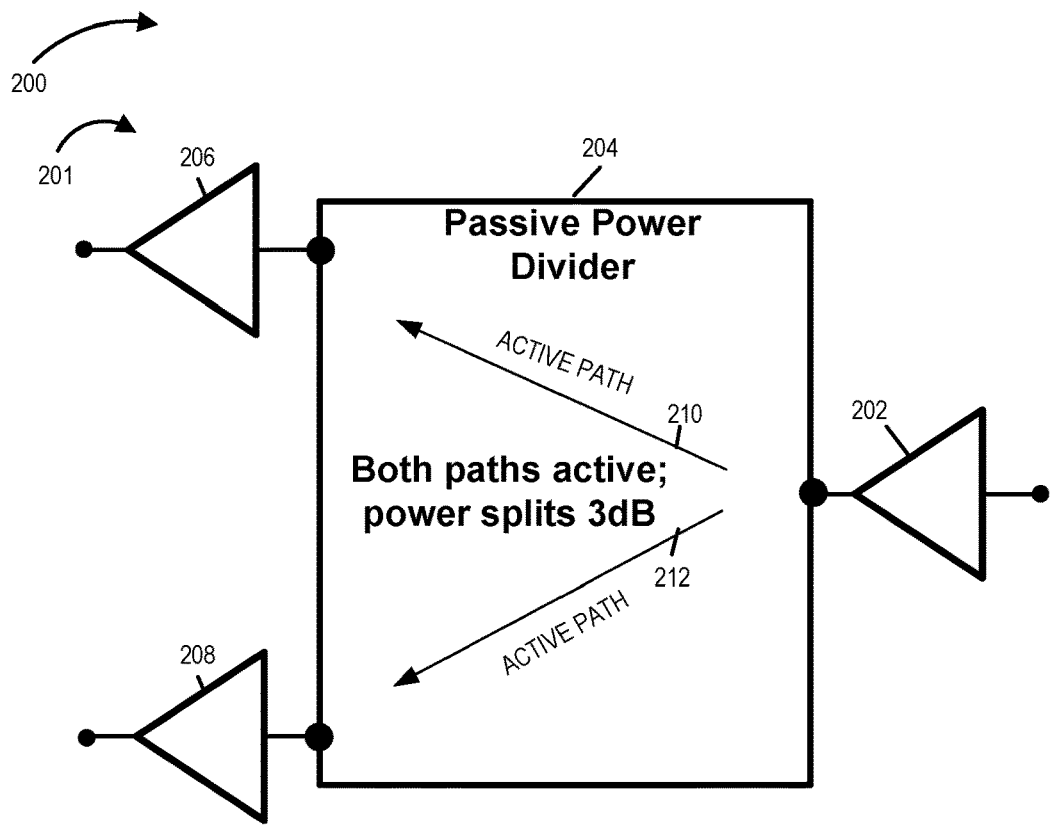
FIG. 2 is a drawing which shows prior art passive power divider operation under different conditions.
Figure 2:
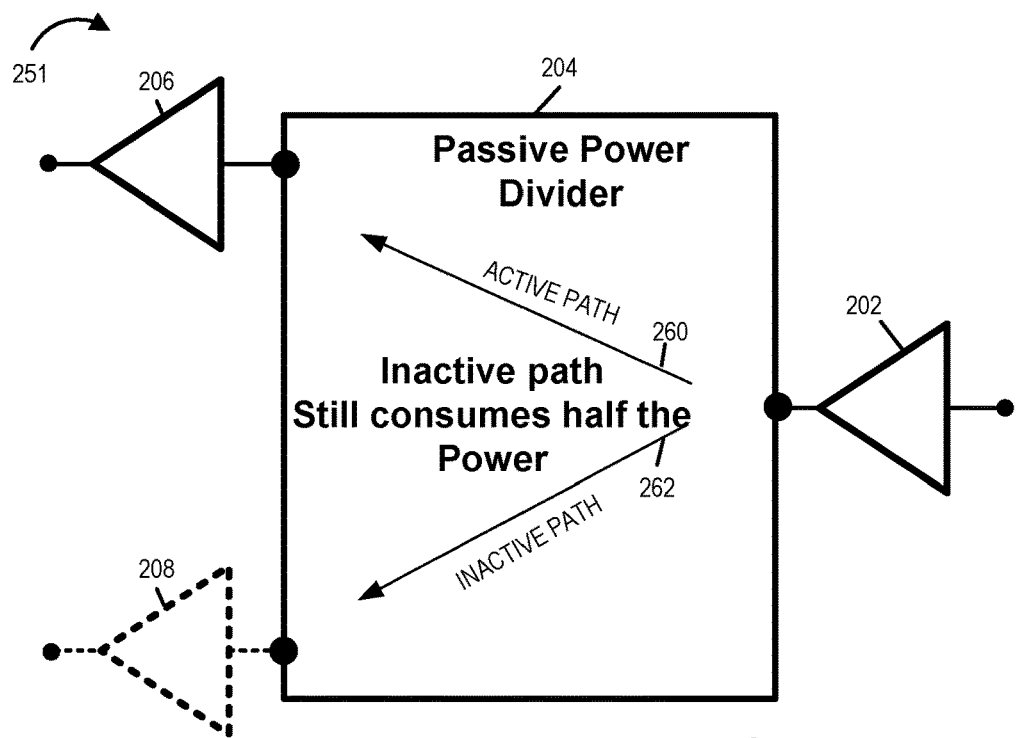
Figure 3:
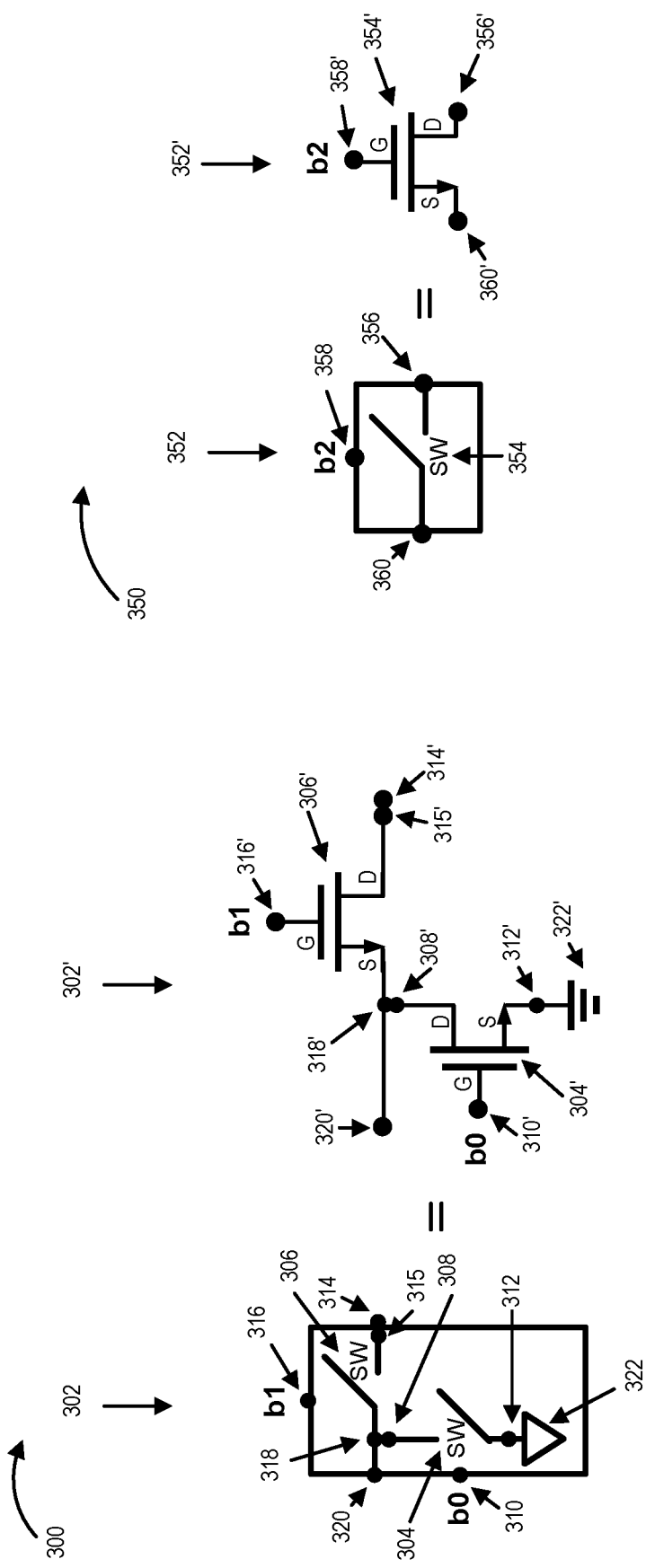
FIG. 3 illustrates exemplary two switch switching modules and single switch switching modules which can be, and sometimes are, used in various embodiments of the present invention, e.g., included within a passive power combiner/splitter implemented in accordance with one or more features of the present invention.

FIG. 3 includes drawing 300 which includes exemplary two switch switching modules 302, 302', which can be, and sometimes are, used in various embodiments of the present invention, e.g., included within a passive power combiner/splitter implemented in accordance with one or more features of the present invention.

Two switch switching module 302 includes a first switch 304 and a second switch 306 coupled together as shown. Switching module 302 includes external switching module connection terminals 320 and 314 and control input terminals 310, 316. Control input terminal 310, which receives control signal b0, is the control input terminal for controlling first switch 304. Control input terminal 316, which receives control signal b1, is the control input terminal for controlling second switch 306.

The first switch 304 includes first and second switch leads 308, 312, one on each side of the first switch 304. The second switch 306 includes first and second switch leads 315, 318, one on each side of the second switch 306. Lead 312 of first switch 304 is connected to ground 322. Lead 308 of first switch 304 is connected to lead 318 of second switch 306. Leads 308, 318 are connected to external switching module connection terminal 320. Lead 315 is connected to external switching module connection terminal 314.

Figure 4:
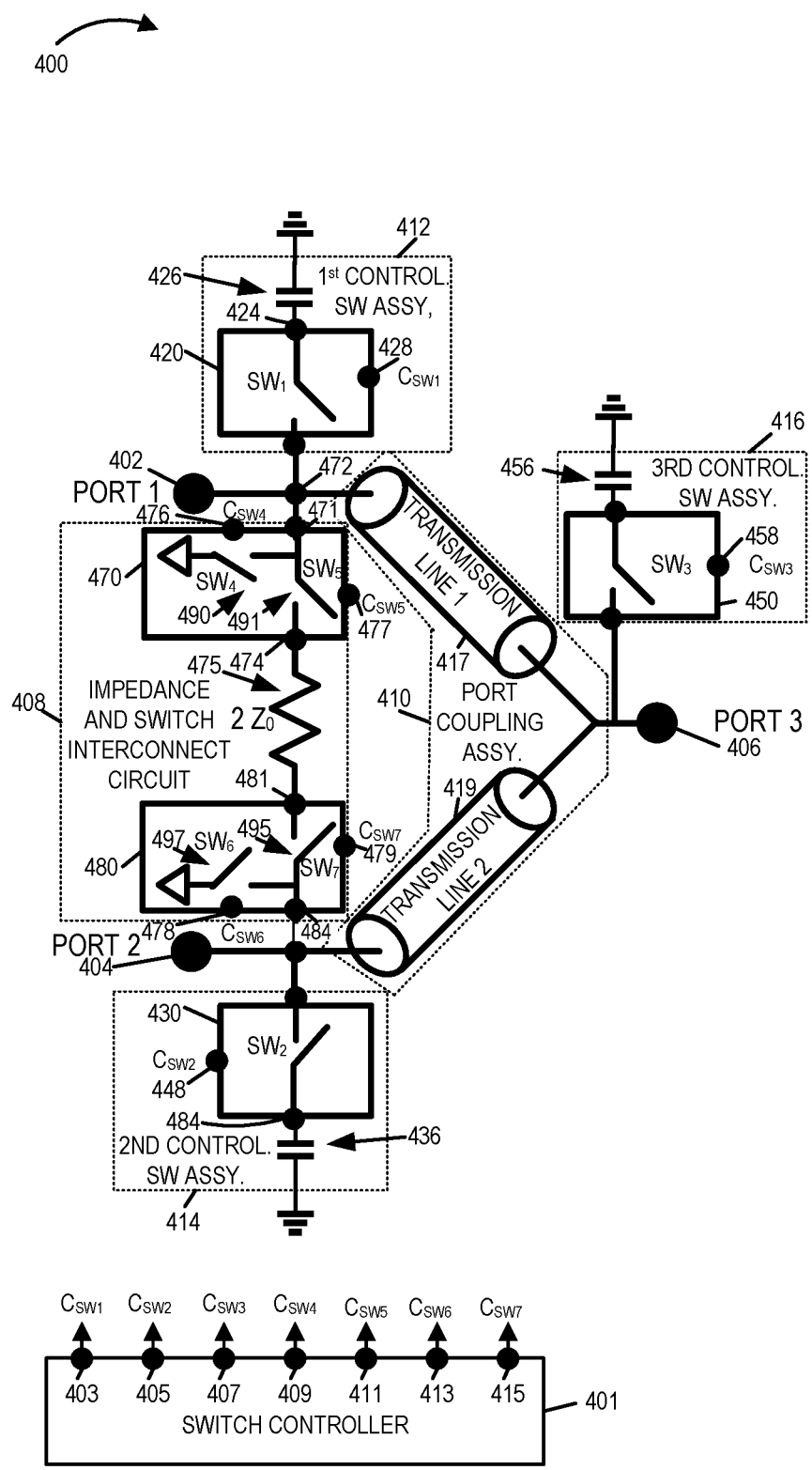
FIG. 4 includes a drawing of an exemplary reconfigurable power divider/combiner and exemplary switch controller in accordance with an exemplary embodiment.
Figure 8:
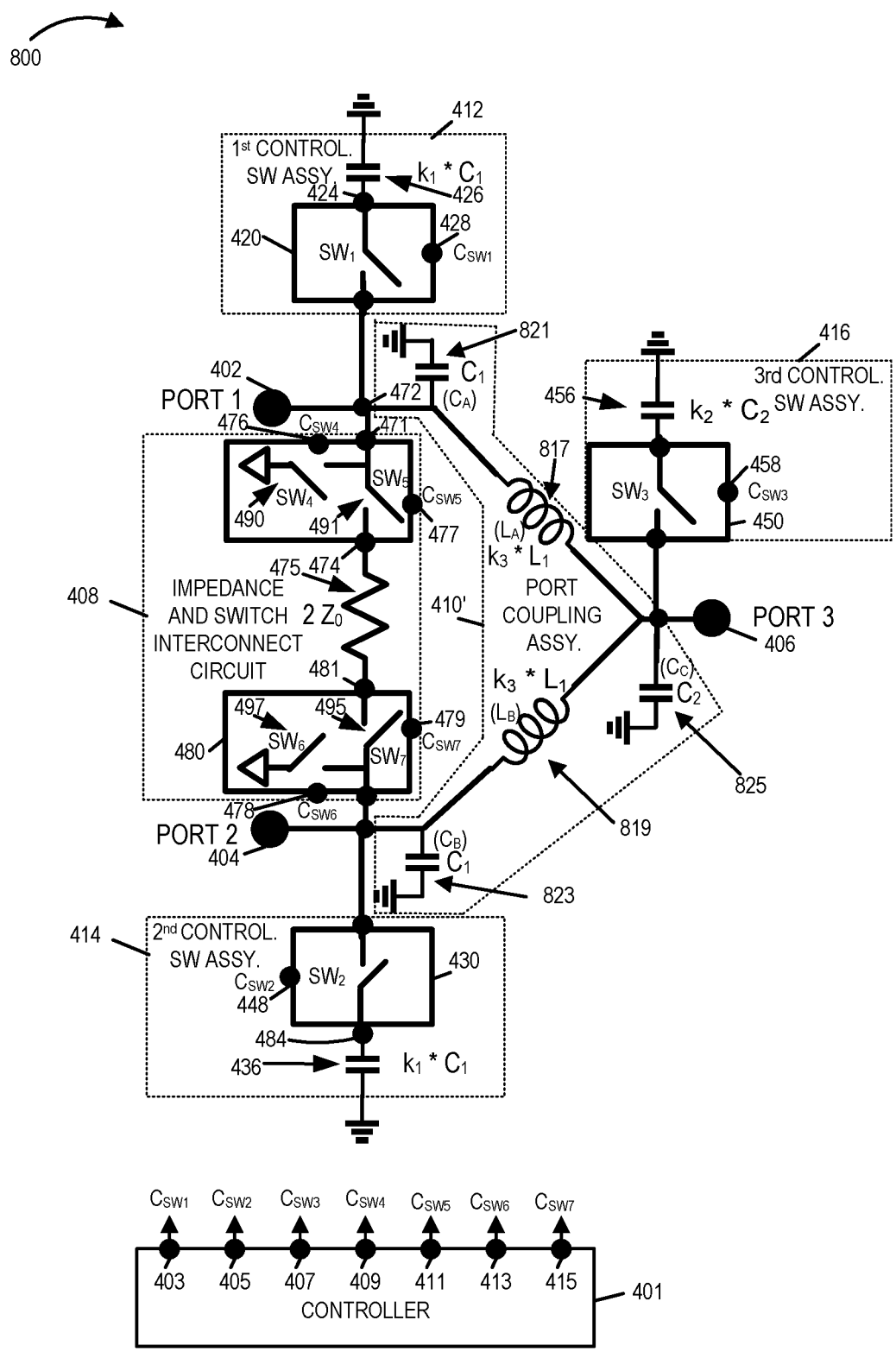
FIG. 8 includes a drawing of an exemplary reconfigurable power divider/combiner and an exemplary switch controller in accordance with an exemplary embodiment.

Two switch switching module 302 is, e.g., first switching module 470 or second switching module 480, included in circuit assembly 400 of FIG. 4 or circuit assembly 800 of FIG. 8.

In some embodiments, the switches 304, 306 in two switch switching module 302 are implemented using FETs; however, in other embodiments, the switches can be, and sometimes are, implemented using other elements. Two switch switching module 302' is one example of two switch switching module 302 in which the switches are implemented using field effect transistors (FETs).

Two switch switching module 302' includes a first N MOSFET 304', which is operated as first switch, and a second N MOSFET 306', which is operated as a second switch, coupled together as shown. Switching module 302' includes external switching module connection terminals 320' and 314' and control input terminals 310', 316'. Control input terminal 310', which receives control signal b0, is the control input terminal for controlling first FET 304'. The control input terminal 310' is connected to the gate (G) lead of the first FET 304'. Control input terminal 316', which receives control signal b1, is the control input terminal for controlling second FET 306'. The control input terminal 316' is connected to the gate (G) lead of the second FET 306'.

The first FET 304' includes a drain (D) lead 308' and a source (S) lead 312'. The second FET 306' includes a drain (D) lead 315' and a source (S) lead 318'. Source (S) lead 312' of first FET 304' is connected to ground 322'. The drain (D) lead 308' of first FET 304' is connected to source (S) lead 318' of second FET 306'. Leads 308, 318 are connected to external switching module connection terminal 320'. The drain (D) lead 315' of the second FET 306' is connected to external switching module connection terminal 314'.

Two switch switching module 302' is, e.g., used to implement first switching module 470 and/or second switching module 480 included in impedance and switch interconnect circuit 408 of circuit assembly 400 of FIG. 4 or circuit assembly 800 of FIG. 8.

Drawing 300 of FIG. 3 further includes exemplary two single switch switching modules 352, 352', which can be, and sometimes are, used in various embodiments of the present invention, e.g., included within a passive power combiner/splitter implemented in accordance with one or more features of the present invention. Exemplary single switch switching modules 352 includes switch 354. Switching module 352 includes external switching module connection terminals 360 and 356 and control input terminal 358. Control input terminal 358, which receives control signal b2, is the control input terminal for controlling switch 354.

Single switch switching module 352 is, e.g., switch 420, switch 430 or switch 450, included in 1st, 2nd or 3rd controllable switching assemblies (412, 414, 416) of circuit assembly 400 of FIG. 4 or circuit assembly 800 of FIG. 8.

In some embodiments, the switch 354 in single switch switching module 352 is implemented using a FET; however, in other embodiments, the switch can be, and sometimes is, implemented using a different element. Single switch switching module 352' is one example of single switch switching module 352 in which the switch is implemented using a field effect transistor (FET).

Exemplary switching module 352' includes one N MOSFET 354'. The gate (G) lead of the FET 354' is connected to control input terminal 358' which receives control signal b2. The source (S) lead of FET 354' is connected to external switching module connection terminal 360'. The drain (D) lead of FET 354' is connected to external switching module connection terminal 356'.

Single switch switching module 352' is, e.g., an implementation of switch 420, switch 430 or switch 450, included in 1st, 2nd or 3rd controllable switching assemblies (412, 414, 416) of circuit assembly 400 of FIG. 4 or circuit assembly 800 of FIG. 8.

FIG. 4 includes a drawing of an exemplary reconfigurable power divider/combiner 400 and exemplary switch controller 401 in accordance with an exemplary embodiment. In some embodiments, the controller 401 is considered to be part of the reconfigurable power divider/combiner 400. In other embodiments, the controller 401 is considered to external to, but coupled to, the reconfigurable power divider/combiner 400. The reconfigurable power divider/combiner 400 includes a first port (Port 1) 402, a second port (Port 2) 404, a third port (Port 3) 406, an impedance and switch interconnect circuit 408, a port coupling assembly 410, a first controllable switch assembly 412, a second controllable switch assembly 414, and a third controllable switch assembly 414, coupled together as shown. The impedance and switch interconnect circuit 408 controllable connects the first port 402 to second port 404. The port coupling assembly 410 couples the first and second ports (402, 404) to the third port 406. The first controllable switch assembly 412 controllably couples the first port 402 to ground via the capacitor 426. The second controllable switch assembly 414 controllably couples the second port 404 to ground via the capacitor 436. The third controllable switch assembly 416 controllably couples the third port 406 to ground via the capacitor 456.

The circuit assembly 400 is a passive device which does not provide a positive gain to signals passing between ports of the circuit assembly.

The first controllable switch assembly 412 includes a first switch (SW1) 420 and a first capacitor 426 arranged in series, the series arrangement of the first switch 420 and first capacitor 426 couples the first port 402 to ground, via the first capacitor 426, when the first switch 420 is controlled to be in a closed position but not when the first switch 420 is controlled to be in an open position. The first switch 420 includes a first switch control input 428 for receiving a control signal (CSW1) used to control the position of the first switch 420.

The second controllable switch assembly 414 includes a second switch (SW2) 430 and a second capacitor 436 arranged in series, the series arrangement of the second switch 430 and second capacitor 436 couples the second port 404 to ground, via the second capacitor 436, when the second switch 430 is controlled to be in a closed position but not when the second switch 430 is controlled to be in an open position. The second switch 430 includes a second switch control input 448 for receiving a control signal (CSW2) used to control the position of the second switch 430.

The third controllable switch assembly 416 includes a third switch (SW3) 450 and a third capacitor 456 arranged in series, the series arrangement of the third switch 450 and third capacitor 456 couples the third port 406 to ground, via the third capacitor 456, when the third switch 450 is controlled to be in a closed position but not when the third switch 450 is controlled to be in an open position. The third switch 450 includes a third switch control input 458 for receiving a control signal (CSW3) used to control the position of the third switch 450.

The impedance and switch interconnect circuit 408 includes a first switching module 470, a second switching module 480, and a coupling impedance 475, which is impedance 2 Z0. In some embodiments, coupling impedance 475 is a coupling resistance.

The first switching module 470 includes a fourth switch (SW4) 490 and a fifth switch (SW5) 491. The fifth switch 491 controllably couples a first terminal 471 of the first switching module 470 to the second terminal 474 of the first switching module 470. The fifth switch 491 also controllable couples a first side of the coupling impedance (2Z0) 475 to the first port 402. The fourth switch 490 controllably connects the first terminal 471 of the first switching module 470 to ground.

The second switching module 470 includes a sixth switch (SW6) 497 and a seventh switch (SW7) 495. The seventh switch 495 controllably couples a first terminal 481 of the second switching module 480 to the second terminal 484 of the first switching module 470. The seventh switch 495 also controllable couples a second side of the coupling impedance (2Z0) 475 to the second port 404. The sixth switch 497 controllably connects the second terminal 484 of the second switching module 480 to ground.

The port coupling assembly 410 includes a first transmission line (transmission line 1) 417 and a second transmission line (transmission line 2) 419. The first transmission line 417 couples the first port 402 to the third port 406. The second transmission line 419 couples the second port 404 to the third port 406.

Switch controller 401 includes first through seventh control signals outputs (CSW1 403, CSW2 405, CSW3 407, CSW4 409, CSW5 411, CSW6 413, CSW7 415) coupled to corresponding control signal inputs (428, 448, 458, 476, 477, 478, 479) of the first through seventh switches (SW1 420, SW2 430, SW3 450, SW4 490, SW5 491, SW6 497, SW7 495), respectively.

In some embodiments, the switches (SW1 420, SW2 430, SW3 450, SW4 490, SW5 491, SW6 497, SW7 495) are implemented using CMOS devices. In some embodiments, the switches (SW1 420, SW2 430, SW3 450, SW4 490, SW5 491, SW6 497, SW7 495) are implemented using N-type MOSFETs.

In some embodiments, the reconfigurable power divider/combiner 400 is designed to operate at frequency f0, with port impedance Z0. In some such embodiments, the transmission line 1 417 is a quarter wave ($\lambda/4$) transmission line operating at frequency f0 and the impedance value of transmission line 1 417 is sqrt (2) (Z0), and the transmission line 2 419 is a quarter wave ($\lambda/4$) transmission line operating at frequency f0 and the impedance value of transmission line 2 419 is sqrt (2) (Z0).

Figure 5:
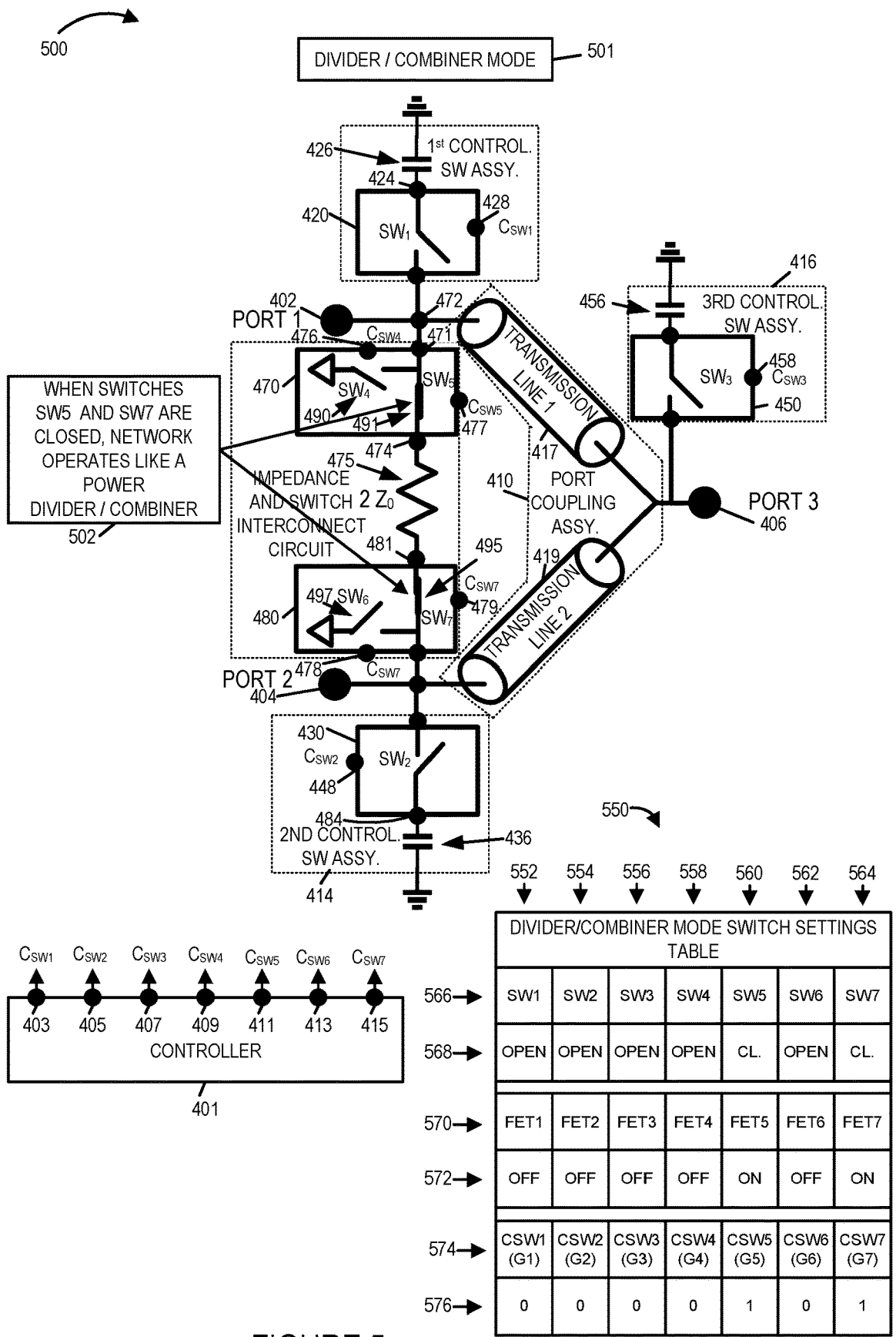
FIG. 5 illustrates the exemplary reconfigurable power divider/combiner and exemplary switch controller of FIG. 4 for an example in which the power divider/combiner has been configured to operate in a divider/combiner mode of operation, in which both paths (1st path between port 1 and port 3 and 2nd path between port 2 and port 3) are active.

FIG. 5 includes drawing 500 which illustrates the exemplary reconfigurable power divider/combiner 400 and exemplary switch controller 401 of FIG. 4 for an example in which the power divider/combiner has been configured to operate in a divider/combiner mode of operation, in which both paths (1st path between port 1 402 and port 3 406 and 2nd path between port 2 404 and port 3 406) are active. Box 501 is a title box which indicates that the mode of operation is divider/combiner mode. As indicated by box 502, when switches SW5 491 and SW7 495 are closed (as shown in FIG. 5), the network operates like a power divider/combiner.

FIG. 5 further includes divider/combiner mode switch setting table 550, which indicates switch settings and corresponding information for the divider/combiner mode of operation. First column 552 includes SW1 420 information. Second column 554 includes SW2 430 information. Third column 556 includes SW3 450 information. Fourth column 558 includes SW4 490 information. Fifth column 560 includes SW5 491 information. Sixth column 562 includes SW6 497 information. Seventh column 564 includes SW7 495 information. First row 566 identifies the switches. Second row 568 identifies whether each switch is controlled to be open or closed (CL). Third row 570 identifies (for one exemplary embodiment), that each switch may be a FET, e.g., a N MOSFET, and identifies the FET. Fourth row 572 identifies whether the FET is controlled to be OFF or ON. Fifth row 574 identifies (for one exemplary embodiment) that the control signal to control the switch is applied to a gate (G) lead of a FET identified in row 570. Sixth row 576 identifies the logic state (1 or 0) for each control signal applied to the gate lead of each FET.

Figure 6:
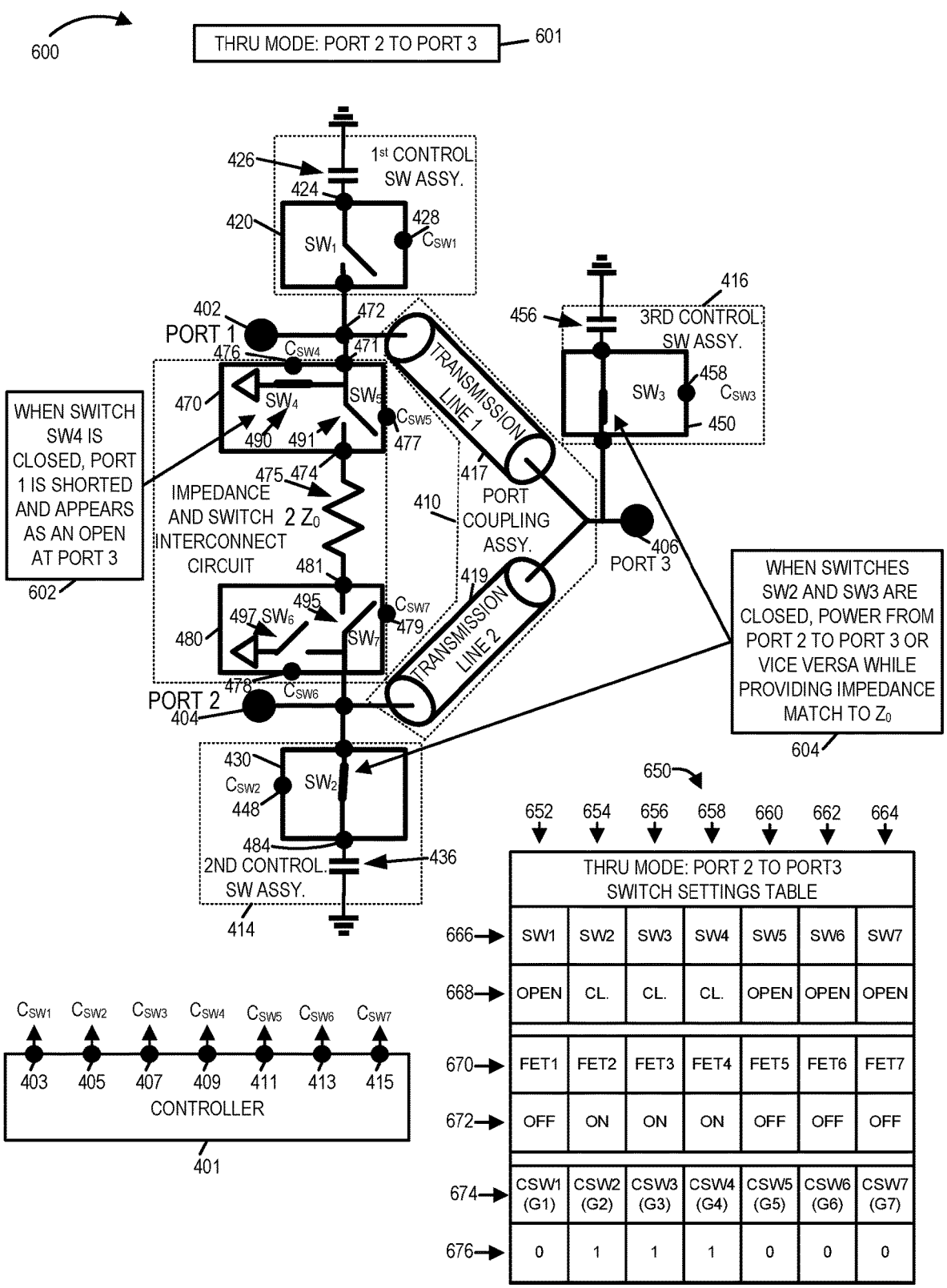
FIG. 6 illustrates the exemplary reconfigurable power divider/combiner and exemplary switch controller of FIG. 4 for an example in which the power divider/combiner has been configured to operate in a thru mode: Port 2 to Port 3 mode of operation, in which the path between Port 2 and Port 3 is active and the path between Port 1 and Port 3 is inactive.

FIG. 6 includes drawing 600 which illustrates the exemplary reconfigurable power divider/combiner 400 and exemplary switch controller 401 of FIG. 4 for an example in which the power divider/combiner has been configured to operate in a thru mode: Port 2 to Port 3 mode of operation, in which the path between Port 2 404 and Port 3 406 is active and the path between Port 1 402 and Port 3 406 is inactive. Box 601 is a title box which indicates that the mode of operation is thru mode: Port 2 to Port 3. As indicated by box 602, when switch SW4 490 is closed (as shown in FIG. 6), Port 1 402 is shorted to ground, and appears as an open at Port 3 406. As indicated by box 604, when switches SW2 430 and SW3 458 are closed (as shown in FIG. 6), power is from Port 2 404 to Port 3 406 or vice versa while providing an impedance match to Z0.

FIG. 6 further includes divider/combiner mode switch setting table 650, which indicates switch settings and corresponding information for the thru mode: Port 2 to Port 3 mode of operation. First column 652 includes SW1 420 information. Second column 654 includes SW2 430 information. Third column 656 includes SW3 450 information. Fourth column 658 includes SW4 490 information. Fifth column 660 includes SW5 491 information. Sixth column 662 includes SW6 497 information. Seventh column 664 includes SW7 497 information. First row 666 identifies the switches. Second row 668 identifies whether each switch is controlled to be open or closed (CL). Third row 670 identifies (for one exemplary embodiment), that each switch may be a FET, e.g., a NMOS FET, and identifies the FETs. Fourth row 672 identifies whether the FET is controlled to be OFF or ON. Fifth row 674 identifies (for one exemplary embodiment) that the control signal to control the switch is applied to a gate (G) lead of a FET identified in row 670. Sixth row 676 identifies the logic state (1 or 0) for each control signal applied to the gate lead of each FET.

Figure 7:
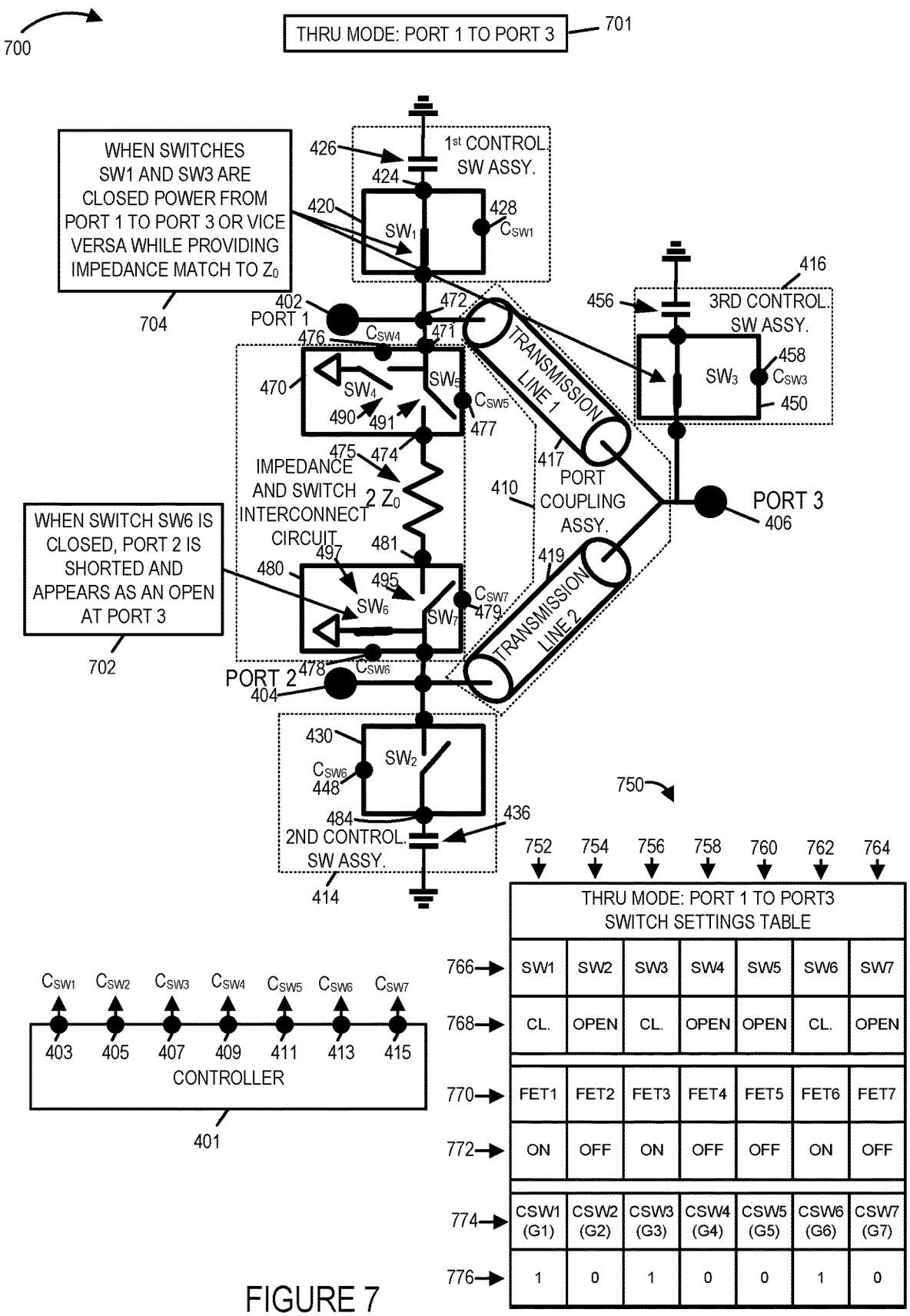
FIG. 7 illustrates the exemplary reconfigurable power divider/combiner and exemplary switch controller of FIG. 4 for an example in which the power divider/combiner has been configured to operate in a thru mode: Port 1 to Port 3 mode of operation, in which the path between Port 1 and Port 3 is active and the path between Port 2 and Port 3 is inactive.

FIG. 7 includes drawing 700 which illustrates the exemplary reconfigurable power divider/combiner 400 and exemplary switch controller 401 of FIG. 4 for an example in which the power divider/combiner has been configured to operate in a thru mode: Port 1 to Port 3 mode of operation, in which the path between Port 1 402 and Port 3 406 is active and the path between Port 2 404 and Port 3 406 is inactive. Box 701 is a title box which indicates that the mode of operation is thru mode: Port 1 to Port 3. As indicated by box 704, when switch SW6 497 is closed (as shown in FIG. 7), Port 2 404 is shorted to ground, and appears as an open at Port 3 406. As indicated by box 704, when switches SW1 420 and SW3 450 are closed (as shown in FIG. 7), power is from Port 1 402 to Port 3 406 or vice versa while providing an impedance match to Z0.

FIG. 7 further includes divider/combiner mode switch setting table 750, which indicates switch settings and corresponding information for the thru mode: Port 1 to Port 3 mode of operation. First column 752 includes SW1 420 information. Second column 754 includes SW2 430 information. Third column 756 includes SW3 450 information. Fourth column 758 includes SW4 490 information. Fifth column 760 includes SW5 491 information. Sixth column 762 includes SW6 497 information. Seventh column 764 includes SW7 495 information. First row 766 identifies the switches. Second row 768 identifies whether each switch is controlled to be open or closed (CL). Third row 770 identifies (for one exemplary embodiment), that each switch may be a FET, e.g., a NMOS FET, and identifies each FET. Fourth row 772 identifies whether the FET is controlled to be OFF or ON. Fifth row 774 identifies (for one exemplary embodiment) that the control signal to control the switch is applied to a gate (G) lead of a FET identified in row 770. Sixth row 776 identifies the logic state (1 or 0) for each control signal applied to the gate lead of each FET.

FIG. 8 includes a drawing of an exemplary reconfigurable power divider/combiner 800 and an exemplary switch controller 401 in accordance with an exemplary embodiment. In some embodiments, the controller 401 is considered to be part of the reconfigurable power divider/combiner 800. In other embodiments, the controller 401 is considered to external to, but coupled to, the reconfigurable power divider/combiner 800. Exemplary reconfigurable power divider/combiner 800 includes the same components as exemplary reconfigurable power divider/combiner 400, with the exception of the port coupling assembly. Port coupling assembly 410' of circuit 800 of FIG. 8 includes two inductors (817, 819), and three capacitors (821, 823, 825), rather than the two transmission lines (417, 419) of port coupling assembly 410 of circuit 400 of FIG. 4. The first inductor (LA) (817) (e.g., with value=k3*L1) couples the first port (402) to the third port (406). The second inductor (LB) (819) (e.g., with value=k3*L1) couples the second port (404) to the third port (406). A first induction balancing capacitor (CA) 821 (e.g., with value C1) couples the first port (402) to ground. A second induction balancing capacitor (CB) 823 (e.g., with value C1) couples the second port (402) to ground. A third induction balancing capacitor (CC) 825 (e.g., with value C2) couples the third port (406) to ground.

In some embodiments, the components of exemplary reconfigurable power divider/combiner 800 satisfies the following equations:

$$0 \le k_1, k_2, k_3 \le 1.$$
$$C_2 = \frac{\sqrt{2}}{Z_0 2\pi f_0}$$
$$C_1 = \frac{1}{\sqrt{2} Z_0 2\pi f_0}$$
$$L_1 = \frac{\sqrt{2} Z_0}{2\pi f_0}$$

Figure 9:
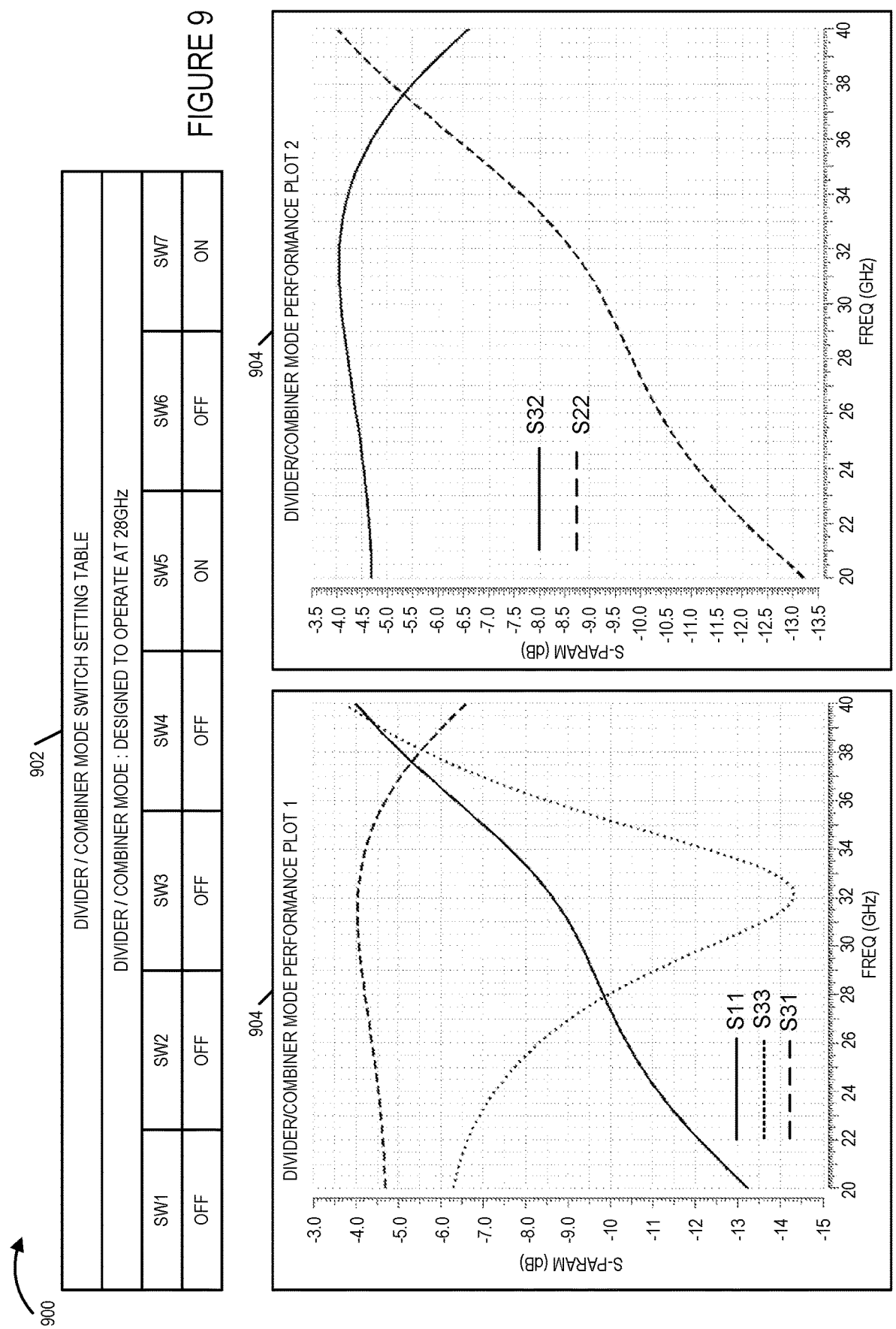
FIG. 9 illustrates divider/combiner switch settings and mode performance corresponding to a exemplary reconfigurable power divider/combiner, implemented in accordance with the present invention, which is being operated in divider/combiner mode of operation.

FIG. 9 is a drawing 900 which illustrates divider/combiner switch settings and mode performance corresponding to an exemplary reconfigurable power divider/combiner, implemented in accordance with the present invention, which is being operated in divider/combiner mode of operation. Drawing 900 includes divider/combiner switch setting table 902 indicating the switch settings for switches SW1, SW2, SW3, SW4, SW5, SW6, SW7 for exemplary reconfigurable power divider/combiner 400 or 800, (designed to operate at 28 GHz) for a divider/combiner mode of operation. Drawing 900 further includes a first and second performance plots 904, 906, corresponding to operation in the divider/combiner mode of operation for exemplary reconfigurable power divider/combiner 400 or 800, (designed to operate at 28 GHz), which show Scattering Parameters (S-Parameters) on the vertical axis in dBs vs frequency in GHz on the horizontal axis. Parameter S11 is represented by a solid line on first performance plot 904. Parameter S33 is represented by a dotted line on the first performance plot 904. Parameter S31 is represented by a dashed line on the first performance plot 904. Parameter S32 is represented by a solid line on second performance plot 906. Parameter S22 is represented by a dashed line on second performance plot 906.

Figure 10:
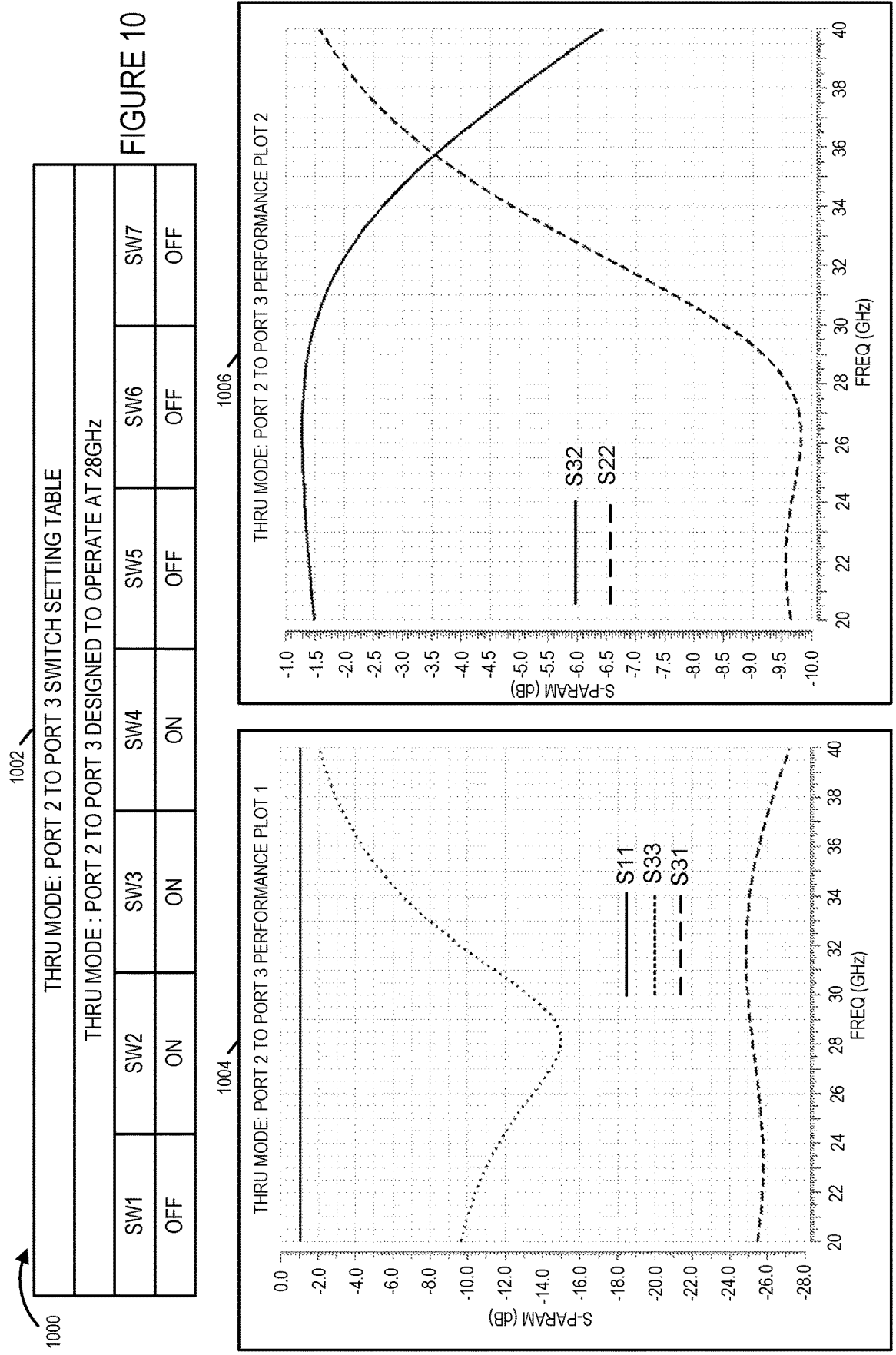
FIG. 10 illustrates thru mode port 2 to port 3 switch settings and thru mode port 2 to port 3 performance corresponding to an exemplary reconfigurable power divider/combiner, implemented in accordance with the present invention, which is being operated in the thru mode port 2 to 3 mode of operation.

FIG. 10 is a drawing 1000 which illustrates thru mode port 2 to port 3 switch settings and thru mode port 2 to port 3 performance corresponding to an exemplary reconfigurable power divider/combiner, implemented in accordance with the present invention, which is being operated in the thru mode port 2 to 3 mode of operation. Drawing 1000 includes divider/combiner switch setting table 1002 indicating the switch settings for switches SW1, SW2, SW3, SW4, SW5, SW6, SW7 for exemplary reconfigurable power divider/combiner 400 or 800, (designed to operate at 28 GHz) for a thru mode: Port 2 to Port 3 mode of operation. Drawing 900 further includes a first and second performance plots 1004, 1006, corresponding to operation in the thru mode: Port 2 to Port 3 mode of operation for exemplary reconfigurable power divider/combiner 400 or 800, (designed to operate at 28 GHz), which show S-Parameters on the vertical axis in dBs vs frequency in GHz on the horizontal axis. Parameter S11 is represented by a solid line on first performance plot 1004. Parameter S33 is represented by a dotted line on the first performance plot 1004. Parameter S31 is represented by a dashed line on the first performance plot 1004. Parameter S32 is represented by a solid line on second performance plot 1006. Parameter S22 is represented by a dashed line on second performance plot 1006.

Figure 11:
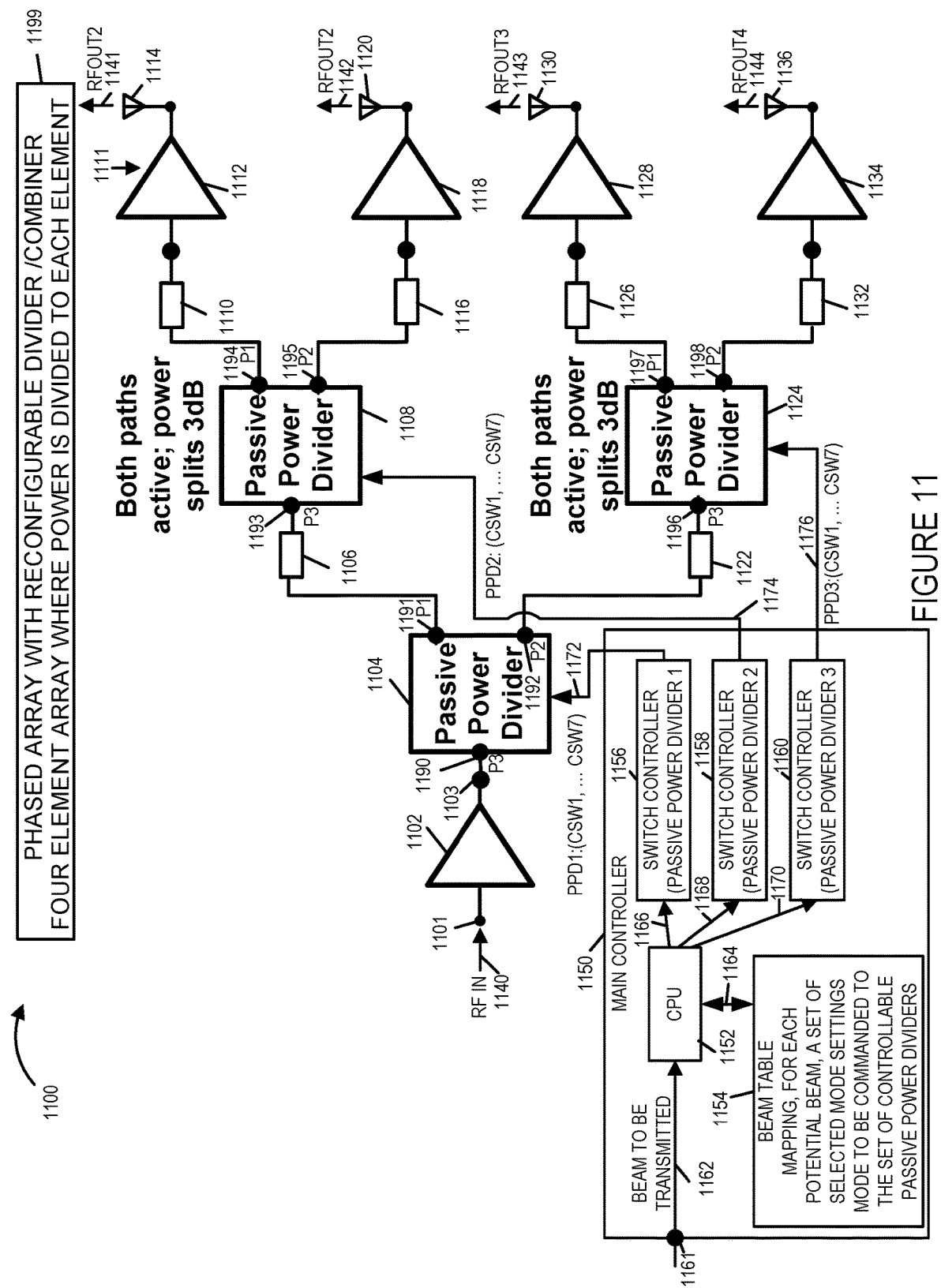
FIG. 11 illustrates an example of an exemplary four element phased array being used in combination with three reconfigurable passive power divider/combiners in accordance with an exemplary embodiment in which power is split between the four elements of the phased array.

FIG. 11 illustrates an example of an exemplary four element phased array 1111 being used in combination with three reconfigurable passive power divider/combiners 1104, 1108, 1124 in accordance with an exemplary embodiment. In the example of FIG. 11 each element of the four element phased array is used for transmission and the power is divided evenly between the elements (output amplifier 1 1112, output amplifier 2 1118, output amplifier 3 1128, output amplifier 4 1134) of the four element phased array 1111. FIG. 11 shows an example in which the reconfigurable passive power divider/combiners 1104, 1108, 1124 are being used as passive power dividers. Box 1199 is a title box, which indicates that FIG. 11 illustrates an exemplary phased array being used in combination with reconfigurable divider/combiners for an example in which power is divided to each element of the four element array.

Communications circuitry assembly 1100 of FIG. 11 includes a first radio frequency (RF) amplifier 1102, three passive reconfigurable power divider/combiners 1104, 1108, 1124, six transmission lines 1106, 1122, 1110, 1116, 1126, 1132, four output amplifiers 1112, 1118, 1128, 1134, and four antennas 1114, 1120, 1130, 1136, coupled together as shown. FIG. 11 shows the passive power divider or combiners 1104, 1108, 1124 as passive power dividers since in the FIG. 11 example the communications circuit assembly 1100 is operating in a transmit mode of operation. The communications circuit assembly 1100 also supports a receive communications mode of operation in which the passive power divider or combiners 1104, 1108, 1124 are operated as power combiners. System 1100 of FIG. 11 further includes a main controller 1150 including a processor, which is CPU 1152, a beam table 1154, and three switch controllers 1156, 1158, 1160 coupled together as shown. In some embodiments, the switch controllers 1156, 1158, 1160 are included as part of the reconfigurable power divider/combiners 1104, 1108, 1124, respectively. Beam table 1154 includes information mapping each potential beam, which may be selected to be transmitted, to a set of selected mode settings to be commanded to the set of controllable passive power divider/combiners. Main controller receives a signal 1162 on control input 1161, which indicates the beam to be transmitted. The CPU 1152 accesses the beam table 1154, via interface 1164, and determines, based on the mapping information, a selected mode of operation for each of the passive reconfigurable power divider/combiners 1104, 1108, 1124. In this example, the CPU determines that each of the passive reconfigurable power divider/combiners 1104, 1108, 1124, should be configured to operate in a divider/combiner mode (in which both paths are active and the power is split evenly (3 dB) between the two paths). The CPU 1152 sends signals 1166, 1168, 1170 to switching controllers 1156, 1158, 1160, respectively, which indicate that the reconfigurable passive power dividers 1104, 1108, 1124 are to be configured for the divider/combiner mode of operation. Switch controller 1156, which controls passive power divider 1 1104, in response to the received signal 1166 sets the control signals lines 1172 (PPD1: CSW1, CSW2, CSW3, CSW4, CSW5, CSW6, CSW7) to the set of values for divider/combiner mode of operation (e.g., 0 0 0 0 1 0 1) and sends the signals to passive reconfigurable power divider/combiner 1 1104, which receives the control signals and sets its seven switches in accordance with the control signals to place the device 1104 in divider/combiner mode in which both paths are active and power is split 3 dBs along the two paths. Switch controller 1158, which controls passive reconfigurable power divider/combiner 2 1108, in response to the received signal 1168, sets the control signals lines 1174 (PPD2: CSW1, CSW2, CSW3, CSW4, CSW5, CSW6, CSW7) to the set of values for divider/combiner mode of operation (e.g., 0 0 0 0 1 0 1) and sends the signals to passive reconfigurable power divider/combiner 2 1108, which receives the control signals and sets its seven switches in accordance with the control signals to place the device 1108 in divider/combiner mode in which both paths are active and power is split 3 dBs along the two paths. Switch controller 1160, which controls passive reconfigurable power divider/combiner 3 1124, in response to the received signal 1170, sets the control signals lines 1176 (PPD3: CSW1, CSW2, CSW3, CSW4, CSW5, CSW6, CSW7) to the set of values for divider/combiner mode of operation (e.g., 0 0 0 0 1 0 1) and sends the signals to passive reconfigurable power divider/combiner 3 1124, which receives the control signals and sets its seven switches in accordance with the control signals to place the device 1124 in divider/combiner mode in which both paths are active and power is split 3 dBs along the two paths.

A RF input signal 1140, which is received on input 1101 of amplifier 1102, is amplified by amplifier 1102, and the amplified signal is input to port 3 (1170) of first passive reconfigurable power divider/combiner 1104, which has been configured for divider/combiner mode. Device 1104, operating as a passive power divider (with two active paths) splits the power with 3 dB along each path, e.g., outputting a 3 dB attenuated signal on both port 1 (1171) and port 2 (1171). The output from port 1 (1171) is an input to transmission line 1106. Then the output signal from the transmission line 1106 in input to the port 3 1173 of the second passive reconfigurable power divider/combiner 1108. The output from port 2 (1172) of the first passive reconfigurable power divider/combiner 1104 is an input to transmission line 1122. Then the output signal from the transmission line 1122 is input to the port 3 (1176) of the third passive reconfigurable power divider/combiner 1124.

Second passive reconfigurable power divider/combiner 1108 has been configured for divider/combiner mode. Device 1108, operating as a passive power divider (with two active paths) splits the power with 3 dB along each path, e.g., outputting a 3 dB attenuated signal on both port 1 (1174) and port 2 (1175). The output from port 1 (1174) is an input to transmission line 1110. Then the output signal from transmission line 1110 is input to first output amplifier 1112, which amplifies the received signal and transmits the amplified signal via antenna 1114 as RFOUT1 signal 1141. The output from port 2 (1175) of the second passive reconfigurable power divider/combiner 1108 is an input to transmission line 1116. Then the output signal from the transmission line 1116 is input to second output amplifier 1118, which amplifies the received signal and transmits the amplified signal via antenna 1120 as RFOUT2 signal 1142.

Third passive reconfigurable power divider/combiner 1124 has been configured for divider/combiner mode. Device 1124, operating as a passive power divider (with two active paths) splits the power with 3 dB along each path, e.g., outputting a 3 dB attenuated signal on both port 1 (1177) and port 2 (1178). The output from port 1 (1177) is an input to transmission line 1126. Then the output signal from the transmission line 1126 is input to third output amplifier 1128, which amplifies the received signal and transmits the amplified signal via antenna 1130 as RFOUT3 signal 1143. The output from port 2 (1178) of the third passive reconfigurable power divider/combiner 1124 is an input to transmission line 1132. Then the output signal from the transmission line 1132 is input to fourth output amplifier 1134, which amplifies the received signal and transmits the amplified signal via antenna 1136 as RFOUT4 signal 1144.

Figure 12:
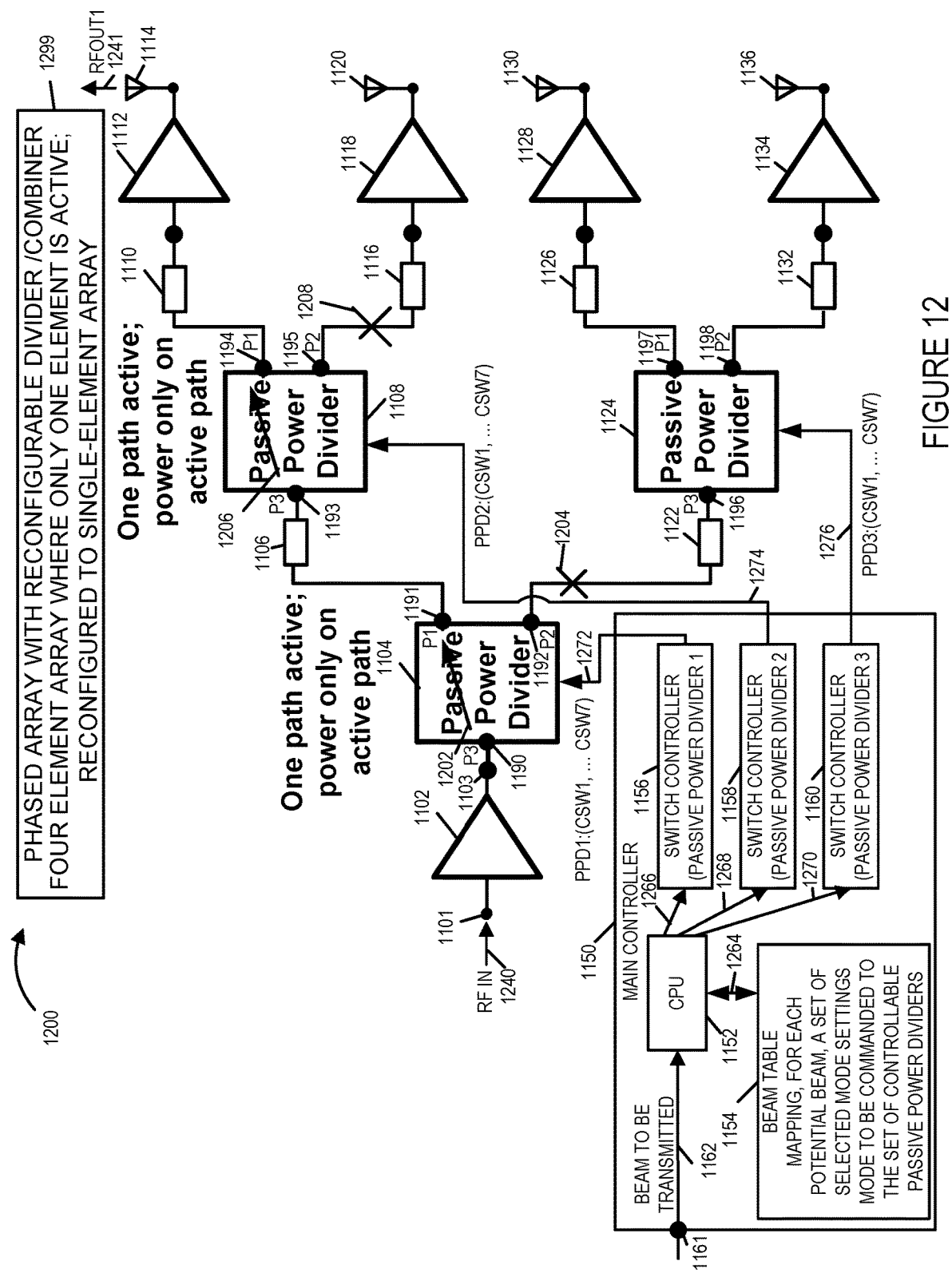
FIG. 12 illustrates an example of an exemplary phased array being used in combination with the three reconfigurable divider/combiners in accordance with an exemplary in which only one element of the phased array is active and the power dedicated to the active element.

FIG. 12 includes drawing 1200 which illustrates an exemplary phased array being used in combination with the three reconfigurable divider/combiners in accordance with an exemplary embodiment. In the example of FIG. 12 there is a four element array, but only one element is active; and the array has been reconfigured to a single-element array. There is only one active path and the power is only on the active path.

FIG. 12 illustrates an example of an exemplary four element phased array 1111 being used in combination with three reconfigurable passive power divider/combiners 1104, 1106, 1124 in accordance with an exemplary embodiment. In the example of FIG. 12 there is a four element array 1111 of FIG. 11, but only one element (first output amplifier 1112) is active; and the array 111 has been reconfigured to a single-element array. There is only one active path and the power is only on the active path. Box 1299 is a title box, which indicates that FIG. 12 illustrates an exemplary phased array being used in combination with reconfigurable divider/combiners for an example in which only one element in the four element array is active.

Circuitry 1200 of FIG. 11 includes first radio frequency (RF) amplifier 1102, three passive reconfigurable power divider/combiners 1104, 1108, 1124, six transmission lines 1106, 1122, 1110, 1116, 1126, 1132, four output amplifiers 1112, 1118, 1128, 1134, and four antennas 1114, 1120, 1130, 1136, coupled together as shown. System 1100 of FIG. 12 further includes main controller 1150 including a processor, which is CPU 1152, a beam table 1154, and three switch controllers 1156, 1158, 1160 coupled together as shown. In some embodiments, the switch controllers 1156, 1158, 1160 are included as part of the reconfigurable power divider/combiners 1104, 1108, 1124, respectively. Beam table 1154 includes information mapping each potential beam, which may be selected to be transmitted, to a set of selected mode settings to be commanded to the set of controllable passive power divider/combiners. Main controller 1150 receives a signal 1162 on control input 1161, which indicates the beam to be transmitted. The CPU 1152 accesses the beam table 1154, via interface 1164, and determines, based on the mapping information, a selected mode of operation for each of the passive reconfigurable power divider/combiners 1104, 1108, 1124. In this example, the CPU 1152 determines that the passive reconfigurable power divider/combiners 1104 and 1108 should be configured to operate in a thru mode: Port 1 to Port 3 mode of operation. CPU 1152 also determines that the passive reconfigurable power divider/combiner 1124 should be configured to operate in a in a divider/combiner mode (in which both paths are active and the power is split evenly (3 dB) between the two paths). The input to passive reconfigurable power divider/combiner 1124, in this example, is not to an active path since the second path through device 1104 is inactive, and thus the selected setting for device 1124 is not relevant, and may be different in some embodiments, e.g., a default setting may be used.

The CPU 1152 sends signals 1266, 1268, 1270 to switching controllers 1156, 1158, 1160, respectively, which indicate that the reconfigurable passive power dividers 1104, 1108, 1124 are to be configured for the thru mode port 1 to port 3 mode of operation, the thru mode port 1 to port 3 mode of operation, and the divider/combiner mode of operation, respectively. Switch controller 1156, which controls passive power divider/combiner 1 1104, in response to the received signal 1266 sets the control signals lines 1272 (PPD1: CSW1, CSW2, CSW3, CSW4, CSW5, CSW6, CSW7) to the set of values for thru mode: port 1 to port 3 mode of operation (e.g., 1 0 1 0 0 1 0) and sends the signals to passive reconfigurable power divider/combiner 1 1104, which receives the control signals and sets its seven switches in accordance with the control signals to place the device 1104 in thru mode port 1 to port 3 in which only the first path is active and power is only on the first path. Switch controller 1158, which controls passive reconfigurable power divider/combiner 2 1108, in response to the received signal 1268, sets the control signals lines 1174 (PPD2: CSW1, CSW2, CSW3, CSW4, CSW5, CSW6, CSW7) to the set of values for thru mode: port 1 to port 3 mode of operation (e.g., 1 0 1 0 0 1 0) and sends the signals to passive reconfigurable power divider/combiner 2 1108, which receives the control signals and sets its seven switches in accordance with the control signals to place the device 1108 in thru mode port 1 to port 3 in which only the first path is active and power is only on the first path. Switch controller 1160, which controls passive reconfigurable power divider/combiner 3 1124, in response to the received signal 1270, sets the control signals lines 1176 (PPD3: CSW1, CSW2, CSW3, CSW4, CSW5, CSW6, CSW7) to the set of values for divider/combiner mode of operation (e.g., 0 0 0 0 1 0 1) and sends the signals to passive reconfigurable power divider/combiner 3 1124, which receives the control signals and sets its seven switches in accordance with the control signals to place the device 1124 in divider/combiner mode in which both paths are active and power is split 3 dBs along the two paths.

A RF input signal 1240, which is received on input 1101 of amplifier 1102, is amplified by amplifier 1102, and the amplified signal is input to port 3 (1170) of first passive reconfigurable power divider/combiner 1104, which has been configured for thru mode: port 1 to port 3. Device 1104, operating in thru mode port 1 to port 3 (with only one path active), as indicated by arrow 1202, outputs signal on port 1 (1171) with power transfer only on the active path. Device 1104 does not output signal on port 2 (1172), as indicated by X 1204.

The output from port 1 (1171) is an input to transmission line 1106. Then the output signal from the transmission line 1106 in input to the port 3 (1173) of the second passive reconfigurable power divider/combiner 1108.

Second passive reconfigurable power divider/combiner 1108 has been configured for thru mode Port 1 to Port 3. Device 1108, operating in thru mode Port 1 to Port 3 (with only one path active), as indicated by arrow 1206, outputs signal on port 1 (1174) with power transfer only on the active path. Device 1108 does not output signal on port 2 (1175), as indicated by X 1208.

The output from port 1 (1174) is an input to transmission line 1110. Then the output signal from the transmission line 1110 is input to first output amplifier 1112, which amplifies the received signal and transmits the amplified signal via antenna 1114 as RFOUT1 signal 1241.

Figure 13:
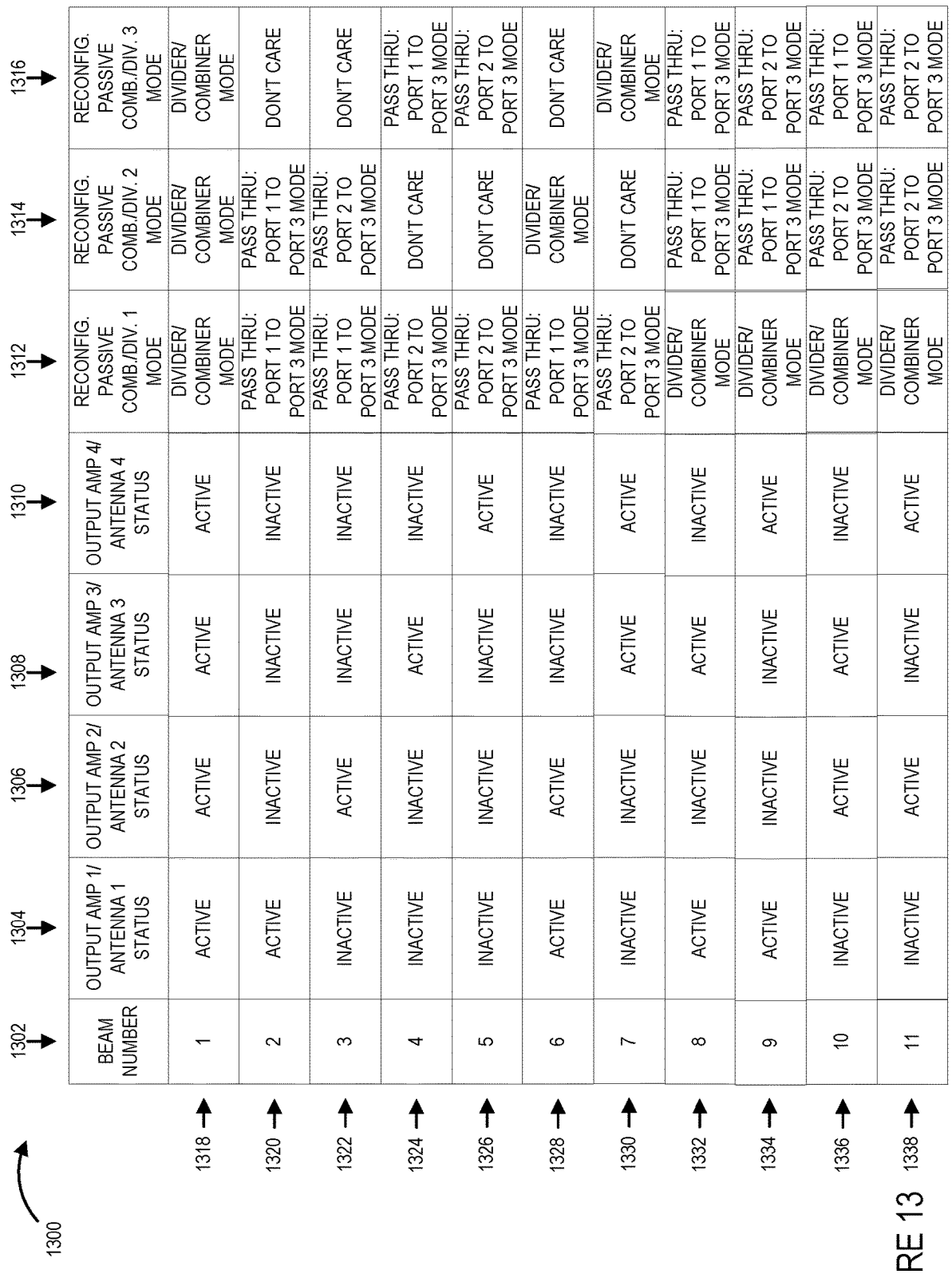
FIG. 13 is a table illustrating exemplary beams which may be transmitted, corresponding status (active or inactive) of each of the output amplifiers/antennas of the four element transmit array, and corresponding mode settings for each of the reconfigurable passive combiner/dividers of the circuitry shown in FIGS. 11 and 12, in accordance with an exemplary embodiment.

FIG. 13 is a table 1300 illustrating exemplary beams which may be transmitted, corresponding status (active or inactive) of each of the output amplifiers/antennas (1112/1114, 1118/1120, 1128/1130, 1134/1136) of the four element transmit array 1111, and corresponding mode settings for each of the reconfigurable passive combiner/dividers (1104, 1108, 1124) of the circuitry shown in FIGS. 11 and 12, in accordance with an exemplary embodiment.

First column 1320 of table 1300 identifies the beam number. Second column 1304 of table 1300 identifies output amplifier 1 1112/antenna 1 1114 status information. Third column 1306 of table 1300 identifies output amplifier 2 1118/antenna 2 1120 status information. Fourth column 1308 of table 1300 identifies output amplifier 3 1128/antenna 3 1130 status information. Fifth column 1310 of table 1300 identifies output amplifier 4 1134/antenna 4 1136 status information. The status of an output amplifier/antenna pair is active (indicating signal transmission) or inactive (indicating no signal transmission).

Sixth column 1312 of table 1300 identifies the configured mode of operation of reconfigurable passive combiner/divider 1 1104. Sixth column 1312 of table 1300 identifies the configured mode of operation of reconfigurable passive combiner/divider 1 1104. Seventh column 1314 of table 1300 identifies the configured mode of operation of reconfigurable passive combiner/divider 2 1108. Eighth column 1316 of table 1300 identifies the configured mode of operation of reconfigurable passive combiner/divider 3 1124. The reconfigurable passive power divider/combiners 1104, 1106, 1108 may be configured for i) divider/combiner mode of operation, ii) pass thru: Port 1 to Port 3 mode of operation, or iii) pass thru: Port 2 to 3 mode of operation. Don't care in the table indicates that the divider/combiner may be configured to any of the mode, e.g., because the input path is inactive.

Each row (1318, 1320, 1322, 1324, 1326, 1328, 1330, 1332, 1334, 1336, 1338) of table 1300 indicates a set of data corresponding to a different beam, which may be transmitted. For example, first row 1318 includes a set of information corresponding to exemplary beam with index number=1, which corresponds to the example of FIG. 11. Each of the four output amplifier/antenna pairs (1112/1114, 1118/1120, 1128/1130, 1134/1136) of the four element transmit array 1111 are active, and each of the reconfigurable power divider/combiners (1104, 1108, 1124) are set to operate in the divider/combiner mode of operation. As another example, second row 1320 includes a set of information corresponding to exemplary beam with index number=2, which corresponds to the example of FIG. 12. First output amplifier/antenna pair (1112/1114) of the four element transmit array 1111 is active; second, third and fourth output amplifier/antenna pairs (1118/1120, 1128/1130, 1134/1136) of the four element transmit array 1111 are inactive. Reconfigurable power divider/combiner 1 1104 is set to operate in the divider/combiner mode of operation. Reconfigurable power divider/combiner 2 1108 is set to operate in the pass thru: Port 1 to Port 3 mode of operation. Reconfigurable power divider/combiner 3 1124 may be set to operate in any of the modes of operation (divider/combiner, pass thru: Port 1 to Port 3 mode, or pass thru: Port 2 to Port 3 mode) as it is listed as a don't care condition.

FIRST NUMBERED LIST OF EXEMPLARY APPARATUS EMBODIMENTS

Apparatus Embodiment 1. A circuit assembly (400 or 800) operable as either a power divider or power combiner, the circuit assembly comprising: a first port (402); a second port (404); an impedance and switch interconnect circuit (408) controllably connecting the first port (402) to the second port (404); a third port (406); a port coupling assembly (410 or 410' see FIG. 8 for 410') coupling the first and second ports (402, 404) to the third port (406); a first controllable switch assembly (412) controllably coupling the first port (402) to ground (via a capacitor (426)); a second controllable switch assembly (414) controllably coupling the second port (404) to ground (via a capacitor (436)); and a third controllable switch assembly (416) controllably coupling the third port (406) to ground (via a capacitor (456)).

Apparatus Embodiment 1A. The circuit assembly (400 or 800) of Apparatus Embodiment 1, wherein the circuit assembly is a passive device which does not provide a positive gain to signals passing between ports of the circuit assembly.

Apparatus Embodiment 2. The circuit assembly (400 or 800) of Apparatus Embodiment 1, wherein said first controllable switch assembly (412) includes a first switch (420) and a first capacitor (426) arranged in series, the series arrangement of the first switch (420) and first capacitor (426) coupling the first port (402) to ground (via the first capacitor (426)) when the first switch (420) is controlled to be in a closed position but not when the first switch (420) is controlled to be in an open position.

Apparatus Embodiment 2A. The circuit assembly (400 or 800) of Apparatus Embodiment 2, wherein said first switch (420) includes a first switch control input (428) for receiving a control signal (CSW1) used to control the position of the first switch (420).

Apparatus Embodiment 3. The circuit assembly (400 or 800) of Apparatus Embodiment 2, wherein said second controllable switch assembly (414) includes a second switch (430) and a second capacitor (436) arranged in series, the series arrangement of the second switch (430) and second capacitor (436) coupling the second port (404) to ground (via the second capacitor (436)) when the second switch (430) is controlled to be in a closed position but not when the second switch (430) is controlled to be in an open position.

Apparatus Embodiment 3A. The circuit assembly (400 or 800) of Apparatus Embodiment 3, wherein said second switch (430) includes a second switch control input (448) for receiving a second switch control signal (CSW2) used to control the position of the second switch (430).

Apparatus Embodiment 4. The circuit assembly (400 or 800) of Apparatus Embodiment 3, wherein said third controllable switch assembly (416) includes a third switch (SW3) (450) and a third capacitor (456) arranged in series, the series arrangement of the third switch (450) and third capacitor (456) coupling the third port (406) to ground (via the third capacitor (456)) when the third switch (450) is controlled to be in a closed position but not when the third switch (450) is controlled to be in an open position.

Apparatus Embodiment 4A. The circuit assembly (400 or 800) of Apparatus Embodiment 4, wherein said third switch (450) includes a third switch control input (458) for receiving a third switch control signal (CSW3) used to control the position of the third switch (450).

Apparatus Embodiment 5. The circuit assembly (400 or 800) of Apparatus Embodiment 4, wherein said an impedance and switch interconnect circuit (408) includes: a first switching module (470); a second switching module (480); and a coupling impedance (e.g. resistance) (2 Z0) (475); wherein the first switching module (470) has a first terminal (471) coupled to the first port (402) and a second terminal (474) coupled to a first side of said coupling impedance (475); and wherein the second switching module (480) has a first terminal (481) coupled to a second side of said coupling impedance (475) and a second terminal (484) coupled to the second port (404).

Apparatus Embodiment 6. The circuit assembly (400 or 800) of Apparatus Embodiment 5, wherein said first switching module (470) includes a fourth switch (SW4) (490) and a fifth switch (491) (SW5), the fifth switch (491) (SW5) controllably coupling the first terminal (471) of the first switching module (470) to the second terminal (474) of the first switching module (470), the fourth switch (SW4) controllably connecting the first terminal (471) of the first switching module (470) to ground.

Apparatus Embodiment 6A. The circuit assembly of Apparatus Embodiment 6, wherein the fifth switch (491) (SW5) controllably couples a first side of the coupling impedance (475) (2Z0) to the first port (402).

Apparatus Embodiment 7. The circuit assembly (400 or 800) of Apparatus Embodiment 6, wherein said second switching module (480) includes a sixth switch (SW6) (497) and a seventh switch (495) (SW7), the seventh switch (SW7) (495) controllably coupling the second side of the coupling impedance (2Z0) (475) to the second port (404), the sixth switch (SW6) (497) controllably connecting the second port (404) to ground.

Apparatus Embodiment 7A. The circuit assembly (400 or 800) of claim 7, wherein the seventh switch (SW7)(495) controllably couples the first terminal (481) of the second switching module (480) to the second terminal (484) of the second switching module (480).

Apparatus Embodiment 8. The circuit assembly (400) of Apparatus Embodiment 7, wherein the port coupling assembly (410) includes: a first transmission line (417) coupling the first port (402) to the third port (406); and a second transmission line (419) coupling the second port (404) to the third port (406).

Apparatus Embodiment 9. The circuit assembly (800) of Apparatus Embodiment 7, wherein the port coupling assembly (410') includes: a first inductor (LA) (817) (e.g., with value=k3*L1) coupling the first port (402) to the third port (406); a second inductor (LB) (819) (e.g., with value=k3*L1) coupling the second port (404) to the third port (406); a first induction balancing capacitor (CA) (e.g., with value C1) coupling the first port (402) to ground; a second induction balancing capacitor (CB) (e.g., with value C1) coupling the second port (402) to ground; and a third induction balancing capacitor (CC) (e.g., with value C2) coupling the third port (406) to ground.

Apparatus Embodiment 10. The circuit assembly (400 or 800) of Apparatus Embodiment 6, further comprising: a switch controller (401) having first through seventh control signal outputs (CSW1 403, CSW2 405, CSW2 407, CSW3 409, CSW4 411, CSW5 413, CSW6 415, CSW7 417) coupled to corresponding control signal inputs (428, 448, 458, 476, 477, 478, 479) of the first through seventh switches (SW1 420, SW2 430, SW3 450, SW4 490, SW5 491, SW6 497, SW7 495).

Apparatus Embodiment 11. The circuit assembly (400 or 800) of Apparatus Embodiment 10, wherein when the switch controller (401) sets the first through seventh control signal outputs (CSW1 403, CSW2 405, CSW2 407, CSW3 409, CSW4 411, CSW5 413, CSW6 415, CSW7 417) to a first set of control values (e.g., 0, 0, 0, 0, 1, 0, 1) corresponding to a first mode of operation, the circuit assembly (400 or 800) operates in a first mode of operation (e.g. divider/combiner mode) in which circuit assembly (400 or 800) operates as a power divider when an input signal is applied to the third port (406) and as a power combiner when input signals are applied to the first and second ports (402, 404).

Apparatus Embodiment 12. The circuit assembly (400 or 800) of Apparatus Embodiment 11, wherein when the switch controller (401) sets the first through seventh control signal outputs (CSW1 403, CSW2 405, CSW2 407, CSW3 409, CSW4 411, CSW5 413, CSW6 415, CSW7 417) to a second set of control values (e.g., 0, 1, 1, 1, 0, 0, 0), the circuit assembly (400 or 800) operates in a second mode of operation (e.g., thru mode: port 2 to port 3) in which circuit assembly (400 or 800) operates as a power pass through device passing power between port 2 (404) and port 3 (406) with the connection between port 3 (406) and port 1 (402) being configured in an open state.

Apparatus Embodiment 13. The circuit assembly (400 or 800) of Apparatus Embodiment 11, wherein when the switch controller (401) sets the first through seventh control signal outputs (CSW1 403, CSW2 405, CSW2 407, CSW3 409, CSW4 411, CSW5 413, CSW6 415, CSW7 417) to a third set of control values(e.g., 1, 0, 1, 0, 0, 1, 0), the circuit assembly (400 or 800) operates in a third mode of operation in which circuit assembly (400 or 800) operates as a power pass through device passing power between port 1 (404) and port 3 (406) with the connection between port 3 (406) and port 2 (402) being configured in an open state.

SECOND NUMBERED LIST OF EXEMPLARY APPARATUS EMBODIMENTS

Apparatus Embodiment 14. A communications circuit assembly (1100) comprising: a phased array (1101) including four output amplifiers (1112, 1118, 1128, 1134); four antennas (1114, 1120, 1130, 1136), each of the four antennas (1114, 1120, 1130, 1136) being coupled to a different one of the four output amplifiers (1112, 1118, 1128, 1134); an RF amplifier (1102) including an RF signal input port (1101) for receiving an RF input signal to be transmitted, and an output port (1103) for outputting an amplified RF signal; a first passive power divider or combiner circuit assembly (1104), the first passive power divider or combiner circuit assembly having a third port (Port 3 1190) coupled to the output port (1103) of the RF amplifier (1102), a first port (Port 1 1191) and a second port (Port 2 1192); a second passive power divider or combiner circuit assembly (1108), the second passive power divider or combiner circuit assembly (1108) including a third port (Port 3 1193), a first port (Port 1 1194), and a second port (Port 2 1195), the third port (1193) of the second power divider or combiner circuit (1108) being coupled to the first port (1191) of the first passive power divider or combiner circuit (1104)—the first port (1194) of the second power divider or combiner circuit (1108) being coupled to a first antenna (1114) (via first output amplifier 1112), and the second port (1195) of the second power divider or combiner circuit (1108) being coupled to a second antenna (1120) (via a second output amplifier 1118); and a third passive power divider or combiner circuit assembly (1124), the third passive power divider or combiner circuit assembly (1124) including a third port (1196), a first port (1197), and a second port (1198), the third port (1196) of the third power divider or combiner circuit (1124) being coupled to the second port (1192) of the first passive power divider or combiner circuit (1104), the first port (1197) of the third power divider or combiner circuit (1124) being coupled to a third antenna (1130) (via third output amplifier 1128), and the second port (1198) of the third power divider or combiner circuit (1124) being coupled to a fourth antenna (1136) (via the fourth output amplifier (1134)).

Apparatus Embodiment 15. The communications circuit assembly (1100) of Apparatus Embodiment 14 further comprising: a switch controller (1150) for controlling the first, second, and third passive power divider or combiner circuit assemblies (1104, 1108, 1124) to operate in different modes of operation depending on the antennas (1114, 1120, 1130, and/or 1134) to be used during a first period of time.

Apparatus Embodiment 16. The communications circuit assembly (1100) of claim 15, wherein during the first period of time in which signals are to be transmitted from each of the first through fourth antennas (1114, 1120, 1130, 1136), the switch controller (1150) controls the first, second and third passive power divider or combiner circuit assemblies (1104, 1108, 1128) to operate as power dividers.

Apparatus Embodiment 17. The communications circuit assembly (1100) of Apparatus Embodiment 15, wherein during the second period of time in which signals are to be transmitted from only the first antenna (1114), the switch controller (1150) controls the first and second passive power divider or combiners (1104, 1108) to operate in a single path pass thru mode of operation in which a path between the first port and the third port is active, while a path between the second port and the third port is inactive Apparatus Embodiment 18. The communications circuit assembly (1100) of Apparatus Embodiment 17, wherein during the second period of time in which signals are to be transmitted from only the first antenna (1114) switches in the first passive power divider (1124) are positioned to prevent, power being passed from the first passive power combiner or divider (1104) to the third passive power divider or combiner (1124)(and thus power is not passed from the first power divider to the input of the third power divider).

Apparatus Embodiment 19. The communications circuit assembly (1100), of Apparatus Embodiment 14, wherein the first (1104), second (1108) and third (1124) passive power divider or combiner circuits operate as passive power dividers when operating in one or more different transmit modes of operation; and wherein the first (1104), second (1108) and third (1124) passive power divider or combiner circuits operate as passive power combiners when operating in one or more different receive modes of operation.

Apparatus Embodiment 20. The communications circuit assembly (1100) of Apparatus Embodiment 17, wherein during a third period of time in which signals are to be transmitted from only the first antenna (1114) and the fourth antenna (1144) switches in the first passive power divider (1104) are positioned to pass power from the first passive power combiner or divider (1104) to the second and third passive power divider or combiners (1108 and 1124), switches in the second passive power divider or combiner (1108) are switched to pass power to the first port (1194) of the first passive power divider or combiner (1108) but not to pass power to the second port (1195) of the second passive power divider or combiner (1108), and switches in the third passive power divider or combiner (1124) are switched to pass power to the second port (1198) of the third passive power divider or combiner (1124) but not to pass power to the first port (1197) of the third passive power divider or combiner (1124).

The techniques of various embodiments may be implemented using software, hardware and/or a combination of software and hardware. Various embodiments are directed to apparatus and/or systems, e.g., wireless communications systems, wireless terminals, user equipment (UE) devices, access points, e.g., a WiFi wireless access point, a cellular wireless AP, e.g., an eNB or gNB, user equipment (UE) devices, a wireless cellular systems, e.g., a cellular system, WiFi networks, etc. Various embodiments are also directed to methods, e.g., method of controlling and/or operating a system or device, e.g., a communications system, an access point, a base station, a wireless terminal, a UE device, etc. Various embodiments are also directed to machine, e.g., computer, readable medium, e.g., ROM, RAM, CDs, hard discs, etc., which include machine readable instructions for controlling a machine to implement one or more steps of a method. The computer readable medium is, e.g., non-transitory computer readable medium.

It is understood that the specific order or hierarchy of steps in the processes and methods disclosed is an example of exemplary approaches. Based upon design preferences, it is understood that the specific order or hierarchy of steps in the processes and methods may be rearranged while remaining within the scope of the present disclosure. The accompanying method claims present elements of the various steps in a sample order, and are not meant to be limited to the specific order or hierarchy presented. In some embodiments, one or more processors are used to carry out one or more steps of the each of the described methods.

In various embodiments each of the steps or elements of a method are implemented using one or more processors. In some embodiments, each of elements or steps are implemented using hardware circuitry.

In various embodiments nodes and/or elements described herein are implemented using one or more components to perform the steps corresponding to one or more methods, for example, controlling, establishing, generating a message, message reception, signal processing, sending, communicating, e.g., receiving and transmitting, comparing, making a decision, selecting, making a determination, modifying, controlling determining and/or transmission steps. Thus, in some embodiments various features are implemented using components or in some embodiments logic such as for example logic circuits. Such components may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium, e.g., a non-transitory computer readable medium, including machine executable instructions for causing a machine, e.g., processor and associated hardware, to perform one or more of the steps of the above-described method(s). Some embodiments are directed to a device, e.g., a wireless communications device including a multi-element antenna array supporting beam forming, such as a cellular AP or Wifi AP, a wireless terminal, a UE device, etc., including a processor configured to implement one, multiple or all of the steps of one or more methods of the invention.

In some embodiments, the processor or processors, e.g., CPUs, of one or more devices, are configured to perform the steps of the methods described as being performed by the devices, e.g., communication nodes. The configuration of the processor may be achieved by using one or more components, e.g., software components, to control processor configuration and/or by including hardware in the processor, e.g., hardware components, to perform the recited steps and/or control processor configuration. Accordingly, some but not all embodiments are directed to a device, e.g., access point, with a processor which includes a component corresponding to each of the steps of the various described methods performed by the device in which the processor is included. In some but not all embodiments a device, e.g., wireless communications node such as an access point or base station, includes a component corresponding to each of the steps of the various described methods performed by the device in which the processor is included. The components may be implemented using software and/or hardware.

Some embodiments are directed to a computer program product comprising a computer-readable medium, e.g., a non-transitory computer-readable medium, comprising code for causing a computer, or multiple computers, to implement various functions, steps, acts and/or operations, e.g., one or more steps described above. Depending on the embodiment, the computer program product can, and sometimes does, include different code for each step to be performed. Thus, the computer program product may, and sometimes does, include code for each individual step of a method, e.g., a method of controlling a wireless communications device such as an access point. The code may be in the form of machine, e.g., computer, executable instructions stored on a computer-readable medium, e.g., a non-transitory computer-readable medium, such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The processor may be for use in, e.g., a wireless communications device such as an access point described in the present application.

Numerous additional variations on the methods and apparatus of the various embodiments described above will be apparent to those skilled in the art in view of the above description. Such variations are to be considered within the scope. Numerous additional embodiments, within the scope of the present invention, will be apparent to those of ordinary skill in the art in view of the above description and the claims which follow. Such variations are to be considered within the scope of the invention.

What is claimed is:

1. A circuit assembly operable as either a power divider or power combiner, the circuit assembly comprising:
   a first port;
   a second port;
   an impedance and switch interconnect circuit controllably connecting the first port to the second port, said impedance and switch interconnect circuit including a switching device and an impedance device arranged in series between the first port and second port, said impedance and interconnect circuit being connected at a first end to the first port and being connected at a second end to the second port;

a third port;
a port coupling assembly coupling the first and second ports to the third port, said port coupling assembly having a first terminal coupled to a first end of said impedance and switch interconnect circuit, a second terminal coupled to a second end of said impedance and switch interconnect circuit and a third terminal coupled to the third port;
a first controllable switch assembly controllably coupling the first port to ground;
a second controllable switch assembly controllably coupling the second port to ground; and
a third controllable switch assembly controllably coupling the third port to ground, said first controllable switch assembly, said second controllable switch assembly and said third controllable switch assembly being in addition to said switching device.

2. The circuit assembly of claim 1, wherein said first controllable switch assembly includes a first switch and a first capacitor arranged in series, the series arrangement of the first switch and first capacitor coupling the first port to ground when the first switch is controlled to be in a closed position but not when the first switch is controlled to be in an open position.

3. The circuit assembly of claim 2, wherein said second controllable switch assembly includes a second switch and a second capacitor arranged in series, the series arrangement of the second switch and second capacitor coupling the second port to ground when the second switch is controlled to be in a closed position but not when the second switch is controlled to be in an open position.

4. The circuit assembly of claim 3, wherein said third controllable switch assembly includes a third switch and a third capacitor arranged in series, the series arrangement of the third switch and third capacitor coupling the third port to ground when the third switch is controlled to be in a closed position but not when the third switch is controlled to be in an open position.

5. The circuit assembly of claim 4, wherein said impedance and switch interconnect circuit includes:
a first switching module, which includes said switching device, said switching device being a switch;
a second switching module; and
wherein said impedance device is a coupling impedance;
wherein the first switching module has a first terminal coupled to the first port and a second terminal coupled to a first side of said coupling impedance; and
wherein the second switching module has a first terminal coupled to a second side of said coupling impedance and a second terminal coupled to the second port.

6. The circuit assembly of claim 5, wherein said first switching module includes a fourth switch and a fifth switch, said fifth switch being the switching device, the fifth switch controllably coupling the first terminal of the first switching module to the second terminal of the first switching module, the fourth switch controllably connecting the first terminal of the first switching module to ground.

7. The circuit assembly of claim 6, wherein said second switching module includes a sixth switch and a seventh switch, the seventh switch controllably coupling the second side of the coupling impedance to the second port, the sixth switch controllably connecting the second port to ground.

8. The circuit assembly of claim 7, wherein the port coupling assembly includes:
a first transmission line coupling the first port to the third port; and
a second transmission line coupling the second port to the third port.

9. The circuit assembly of claim 7, wherein the port coupling assembly includes:
a first inductor coupling the first port to the third port;
a second inductor coupling the second port to the third port;
a first induction balancing capacitor coupling the first port to ground;
a second induction balancing capacitor coupling the second port to ground; and
a third induction balancing capacitor coupling the third port to ground.

10. The circuit assembly of claim 6, further comprising:
a switch controller having first through seventh control signal outputs coupled to corresponding control signal inputs of the first through seventh switches.

11. The circuit assembly of claim 10, wherein when the switch controller sets the first through seventh control signal outputs to a first set of control values corresponding to a first mode of operation, the circuit assembly operates in a first mode of operation in which circuit assembly operates as a power divider when an input signal is applied to the third port and as a power combiner when input signals are applied to the first and second ports.

12. The circuit assembly of claim 11, wherein when the switch controller sets the first through seventh control signal outputs to a second set of control values, the circuit assembly operates in a second mode of operation in which circuit assembly operates as a power pass through device passing power between the second port and the third port with a connection between the third port and first port being configured in an open state.

13. The circuit assembly of claim 11, wherein when the switch controller sets the first through seventh control signal outputs to a third set of control values, the circuit assembly operates in a third mode of operation in which the circuit assembly operates as a power pass through device passing power between the first port and the third port with a connection between the third port and second port being configured in an open state.

14. The circuit assembly of claim 1, wherein said impedance and switch interconnect circuit includes said impedance device and a first switch arranged in series, said first switch having a first end connected to the first port and a second end coupled to a first end of the impedance device, said first switch being the switching device.

15. The circuit assembly of claim 14, wherein said impedance and switch interconnect circuit further includes a second switch having a first end coupled to the second port and a second end coupled to a second end of said impedance device.

16. The circuit assembly of claim 15, wherein said port coupling assembly includes:
a first transmission line extending between the first port and the third port and coupling the first port to the third port; and
a second transmission line extending between the second port and the third port and coupling the second port to the third port.

17. The circuit assembly of claim 16, wherein said port coupling assembly, said impedance and switch interconnect circuit, said first controllable switch assembly, said second controllable switch assembly, and said third controllable switch assembly are separate components.

18. The circuit assembly of claim 17, wherein the circuit assembly includes:

one controllable switch assembly for each port of the circuit assembly, each of the controllable switch assemblies including a switch and a capacitor arranged in series with the capacitor being coupled to ground.

19. The circuit assembly of claim 14, wherein said port coupling assembly, said impedance and switch interconnect circuit, said first controllable switch assembly, said second controllable switch assembly, and said third controllable switch assembly are separate components.

20. The circuit assembly of claim 1, wherein said port coupling assembly includes:
- a first transmission line extending between the first port and the third port and coupling the first port to the third port; and
- a second transmission line extending between the second port and the third port and coupling the second port to the third port.

21. The circuit assembly of claim 1, wherein the circuit assembly includes:
- one controllable switch assembly for each port of the circuit assembly, each of the controllable switch assemblies including a switch and a capacitor arranged in series with the capacitor being coupled to ground.

* * * * *